US008653820B2

(12) United States Patent
Dohata et al.

(10) Patent No.: US 8,653,820 B2
(45) Date of Patent: Feb. 18, 2014

(54) MAGNETIC RESONANCE IMAGING APPARATUS, RECEIVING COIL AND METHOD OF MANUFACTURING THE COIL

(75) Inventors: Masayoshi Dohata, Tokyo (JP); Shizuka Nagai, Tokyo (JP); Daisuke Yokoyama, Tokyo (JP)

(73) Assignee: Hitachi Medical Corporation, Tokyo (JP)

( * ) Notice: Subject to any disclaimer, the term of this patent is extended or adjusted under 35 U.S.C. 154(b) by 614 days.

(21) Appl. No.: 12/937,314

(22) PCT Filed: Apr. 7, 2009

(86) PCT No.: PCT/JP2009/057106
§ 371 (c)(1),
(2), (4) Date: Oct. 11, 2010

(87) PCT Pub. No.: WO2009/128365
PCT Pub. Date: Oct. 22, 2009

(65) Prior Publication Data
US 2011/0026801 A1    Feb. 3, 2011

(30) Foreign Application Priority Data
Apr. 18, 2008  (JP) ................................. 2008-109309

(51) Int. Cl.
*G01V 3/00*          (2006.01)
(52) U.S. Cl.
USPC ............................ 324/318; 324/322; 600/422
(58) Field of Classification Search
USPC ............................ 324/318, 319, 322; 600/422
See application file for complete search history.

(56) References Cited

U.S. PATENT DOCUMENTS

| | | | |
|---|---|---|---|
| 5,143,068 A * | 9/1992 | Muennemann et al. | 600/422 |
| 5,327,898 A | 7/1994 | Yoshino et al. | |
| 6,144,203 A | 11/2000 | Richard et al. | |
| 6,778,849 B1 | 8/2004 | Ninomiya et al. | |
| 7,463,031 B2 * | 12/2008 | Kato | 324/318 |
| 7,545,144 B2 * | 6/2009 | Guan et al. | 324/318 |
| 2001/0004564 A1 | 6/2001 | Takagi | |
| 2003/0016109 A1 | 1/2003 | Schulz et al. | |

FOREIGN PATENT DOCUMENTS

| | | |
|---|---|---|
| JP | 5-20404 | 3/1993 |
| JP | 6-53110 | 7/1994 |
| JP | 11-128201 | 5/1999 |
| JP | 2000-279392 | 10/2000 |
| JP | 2001-176620 | 6/2001 |
| JP | 2001-313118 | 11/2001 |
| JP | 2001-524340 | 12/2001 |
| JP | 2002-369808 | 12/2002 |
| JP | 2005-102806 | 4/2005 |
| JP | 2007-229004 | 9/2007 |

OTHER PUBLICATIONS

International Search Report in PCT/JP2009/057106.

* cited by examiner

*Primary Examiner* — Louis Arana
(74) *Attorney, Agent, or Firm* — Cooper & Dunham LLP

(57) ABSTRACT

A magnetic resonance imaging apparatus is provided, characterized by: one pair of static magnetic field generating means disposed sandwiching a space in which a test object is placed; magnetic field generating means configured to apply a high-frequency magnetic field and a gradient magnetic field to the test object placed in the static magnetic field; and receiving means configured to receive a nuclear magnetic resonance signal generated from the test object, and characterized in that: the receiving means includes a receiving coil having a predetermined coil pattern and capable of being shaped into a cylinder; the receiving coil includes flexible parts and rigid parts alternately disposed along the circumference direction when shaped into the cylinder; and the flexible parts include a flexible substrate on which a portion of the predetermined coil pattern is mounted and a air-bubbles-containing resin section for covering the both surfaces of the flexible substrate.

16 Claims, 22 Drawing Sheets

FIG. 1 2
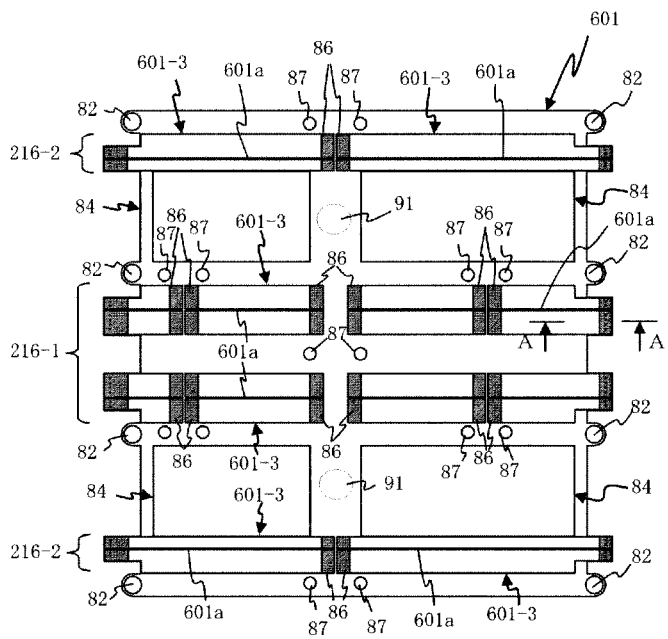
(a-1)
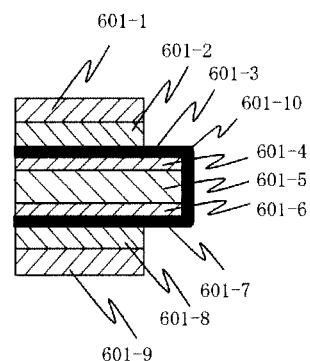
(a-2)
A-A CROSS SECTION FIG.
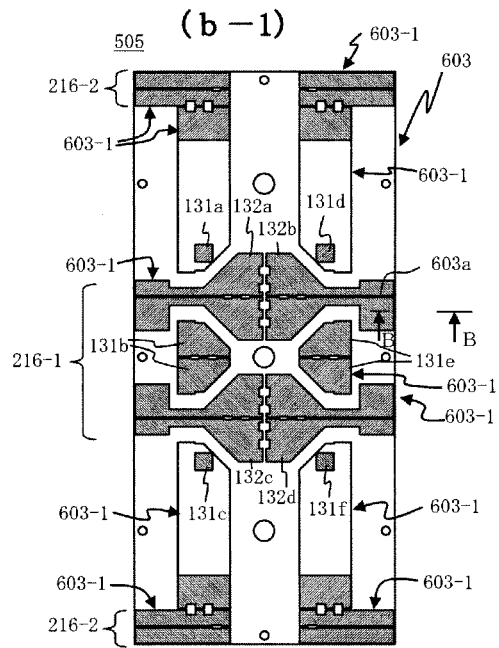
(b-1)
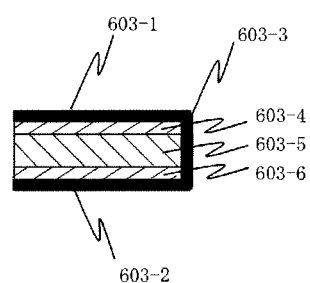
(b-2)
B-B CROSS SECTION FIG.

FIG. 13
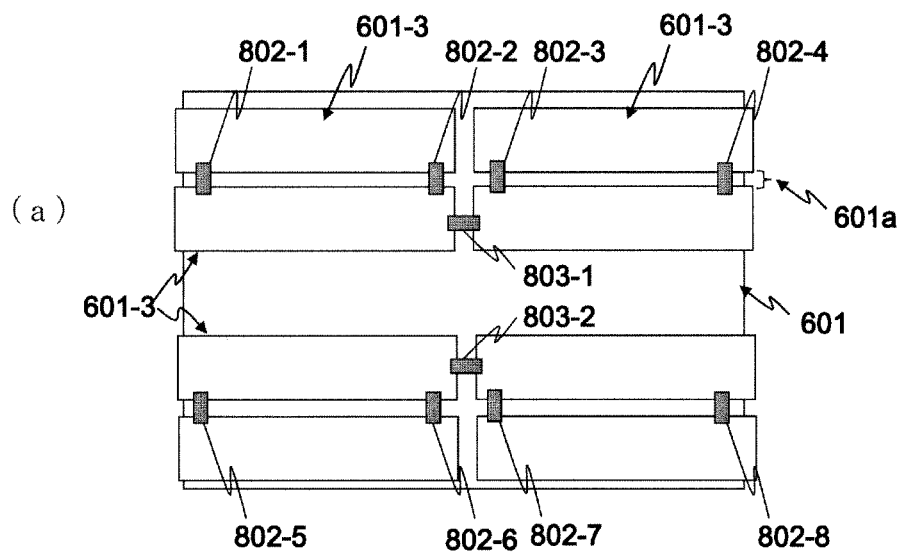
(a)
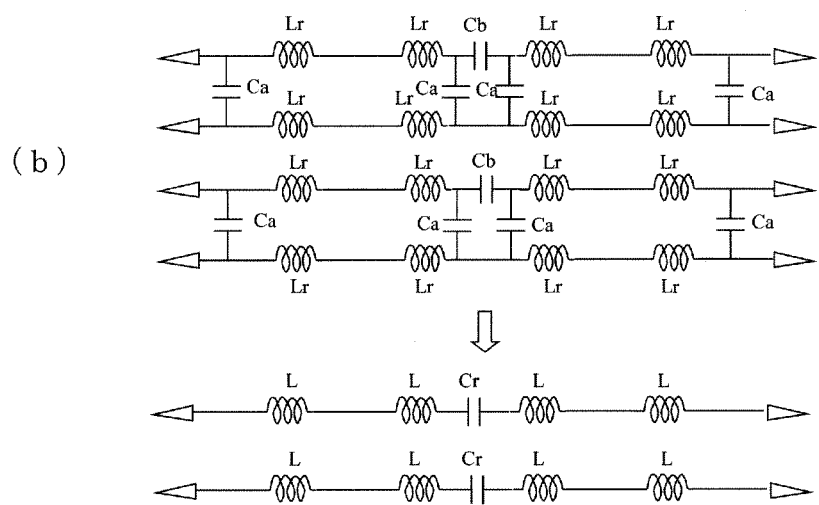
(b)
Cr = Cb

FIG. 14
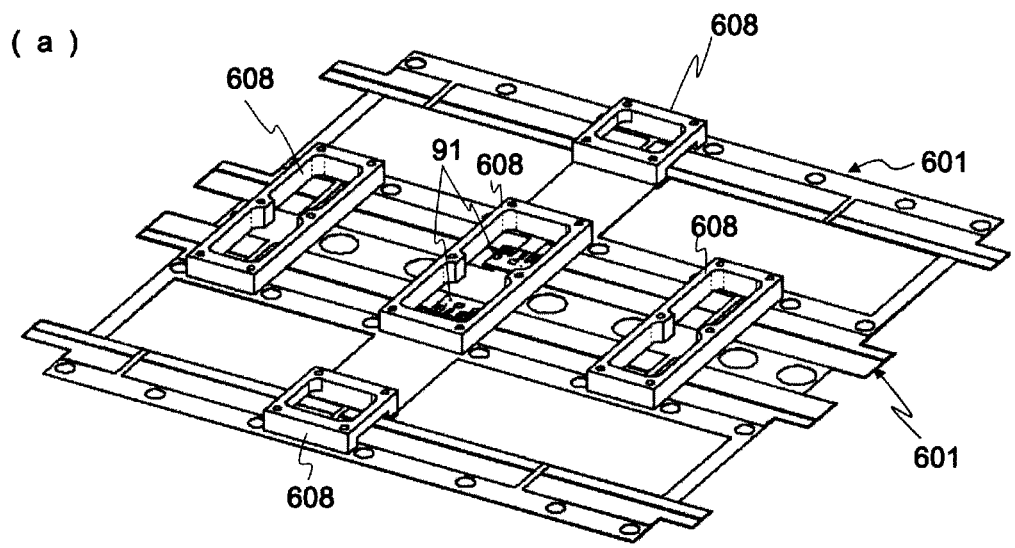
(a)
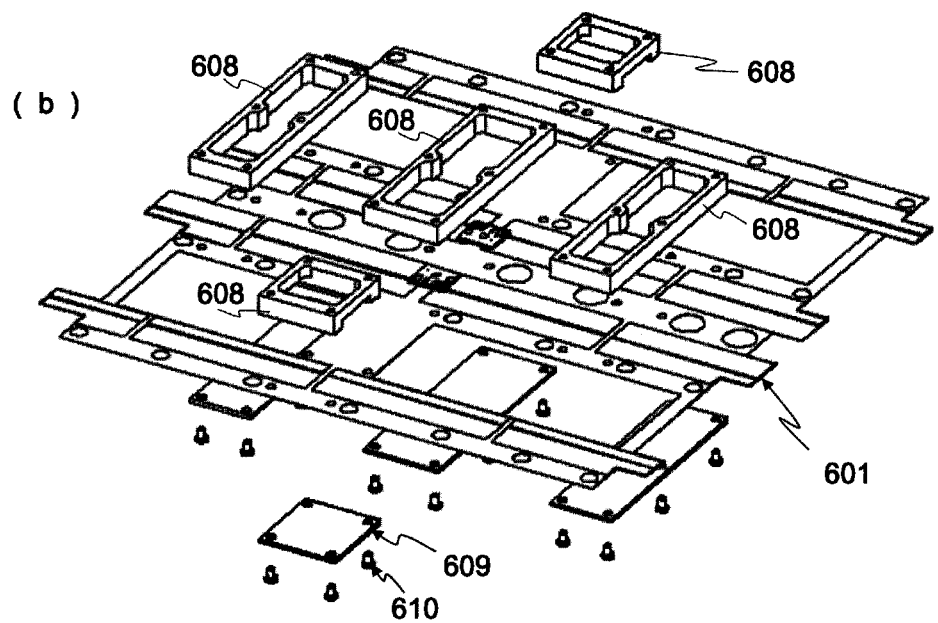
(b)

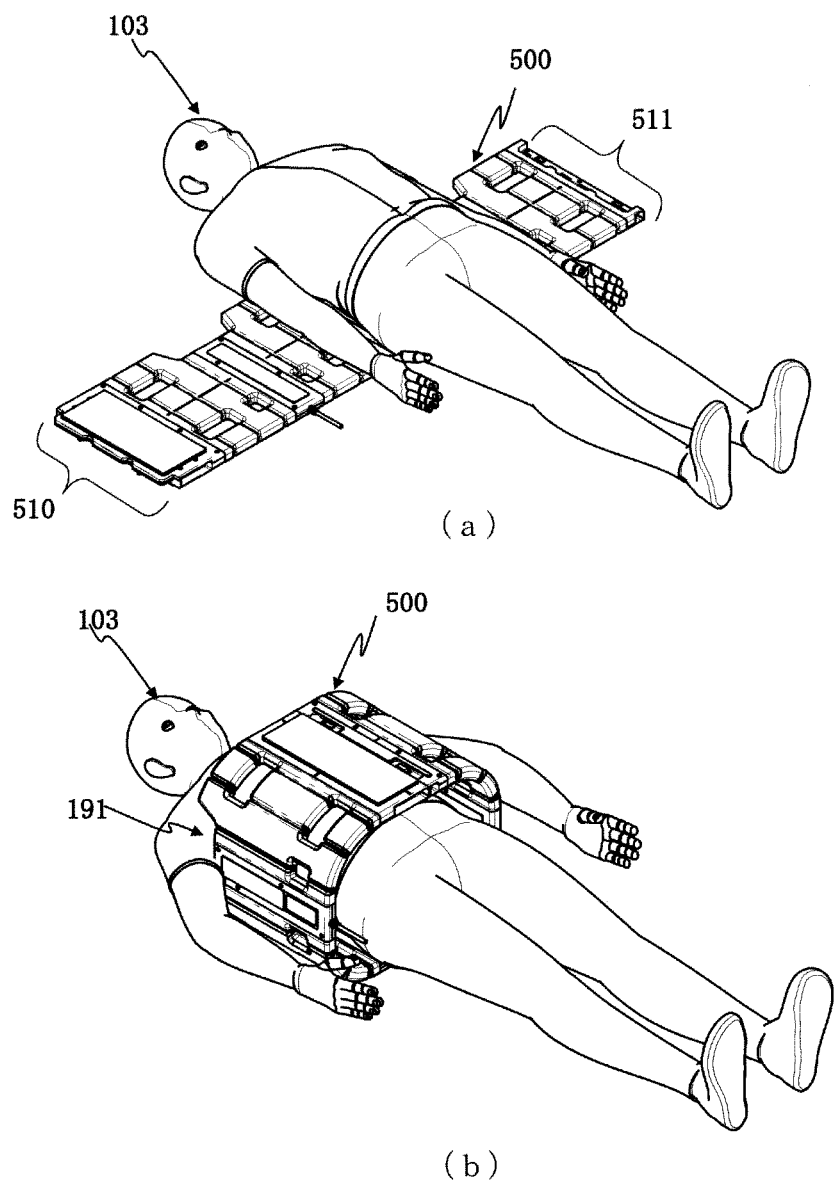

MAGNETIC RESONANCE IMAGING APPARATUS, RECEIVING COIL AND METHOD OF MANUFACTURING THE COIL

TECHNICAL FIELD

The present invention relates to an RF receiving coil used in a magnetic resonance imaging apparatus (MRI apparatus) and, more particularly, to a flexible receiving coil that can be closely fitted to a test object and a method for manufacturing the receiving coil.

BACKGROUND ART

An MRI apparatus arranges a test object in a uniform static magnetic field space, applies a high-frequency magnetic field and a gradient magnetic field to the test object according to a predetermined pulse sequence, and causes a nuclear spin in a certain cross section of the test object to magnetically resonate. Then, the MRI apparatus detects the resulted nuclear magnetic resonance signal, reconstructs the detected signal into an image using two- or three-dimensional Fourier transform or the like, and displays tomographic images.

MRI apparatuses are classified into horizontal magnetic field apparatuses and vertical magnetic field apparatuses depending on the direction of the static magnetic field. In any of the magnetic field apparatuses, a magnetic resonance signal is detected using an RF receiving coil disposed in proximity to the test object. The RF receiving coil needs to be disposed in the direction in which the magnetic resonance signal (magnetic field) perpendicular to the direction of the static magnetic field is detected. Accordingly, the configuration of the receiving coil varies depending on the direction of the static magnetic field.

In a horizontal magnetic field apparatus, by using a tunnel-shaped magnet, a static magnetic field is generated in the same direction as the center axis of the tunnel, and a test object is positioned in the static magnetic field such that the body axis of the test object is along the direction of the static magnetic field. Accordingly, the RF receiving coil needs to be disposed in the direction in which a magnetic field perpendicular to the body axis of the test object is detected, so a saddle-shaped coil or a loop coil to be disposed on the surface of the test object is often used for the RF receiving coil.

On the other hand, in a vertical magnetic field apparatus, two magnets are disposed in the vertical direction, a static magnetic field is generated in the vertical direction between the magnets, and a test object is positioned in the static magnetic field such that the body axis of the test object is perpendicular to the direction of the static magnetic field. Accordingly, the RF receiving coil can be disposed along the direction in which a magnetic field in the body axis direction of the test object is detected, so, conventionally, a solenoid coil wound around the circumference of the test object was often used. Also, a technique of using together two coils the magnetic field directions of which are perpendicular to each other to perform QD (Quadrature Detection) combining in order to improve the sensitivity. In the vertical magnetic field apparatus, in addition to the solenoid coil for detecting the magnetic field in the body axis direction, a saddle-shaped coil for detecting a magnetic field in the body width direction can be used together to perform QD combining.

The sensitivity and SN ratio of the RF receiving coil of the MRI apparatus improve more as the distance to the test object decreases more. Accordingly, the shape of the receiving coil is desirably determined so as to follow the shape of the test object depending on the size and shape of the test object so that an air gap between the test object and the RF receiving coil pattern is as small as possible. Conventionally, various RF receiving coils for accommodating the directions of static magnetic fields and the sizes and shapes of test objects have been invented. However, many of them are fabricated by winding a coil pattern around a bobbin that is made of a resin and is poor in flexibility.

In order to improve this problem, Patent Document 1 describes that both flexible and rigid, nonconductive support members for supporting an RF receiving coil pattern are used, in which flexible parts and rigid parts are alternately connected to each other in the circumference direction into a cylindrical shape. This facilitates the RF receiving coil to be wound around and closely fitted to the test object.

Also, the cylindrical-shaped RF receiving coil described in Patent Document 1 includes connector sections for connecting and disconnecting the coil pattern. When the connector sections are connected, two coil systems (solenoid coil and saddle-shaped coil) that have magnetic field components perpendicular to the static magnetic field direction and perpendicular to each other can be formed. The intersection part of the two coil systems is formed as rigid part to limit the flexibility of deformation, and the coil members of the intersection part are separated from each other by the distance of at least 5 mm. This separation prevents the two coil systems from being electromagnetically coupled.

Also, by determining the lengths of the flexible parts and rigid parts appropriately depending on the area of the test object is to be imaged, the RF receiving coil having a good reception sensitivity and a wide uniform reception area was achieved.

PRIOR ART DOCUMENT

Patent Document

Patent Document 1: JP-B-6-53110

SUMMARY OF THE INVENTION

Problems to be Solved by the Invention

The flexible parts of the RF receiving coil of Patent Document 1 have a coil pattern formed on a flexible sheet made of a resin. Accordingly, as the diameter of the test object increases and the size of the RF receiving coil increases, the weight of the resin sheet increases. Furthermore, when the thickness of the resin sheet is increased in order to increase the reliability of the flexible parts against bending, the weight of the resin sheet further increases. The weight increase of the RF receiving coil increases a load on the test object. Also, the weight increase of the RF receiving coil makes its handling difficult for a operator who fits the RF receiving coil to the test object.

Furthermore, since the RF receiving coil of Patent Document 1 cannot be used with the coil pattern exposed on the resin sheet, the RF receiving coil in use may need to be, for example, entirely covered with a leather cover. Using the cover increases the weight of the RF receiving coil. Also, as the size of the RF receiving coil increases, the size of the cover increases, which in turn increases the weight of the entire RF receiving coil.

It is an object of the present invention to provide a receiving coil to be wound around a test object, the receiving coil being lightweight and flexible.

Means for Solving the Problems

In order to achieve the above object, according to a first aspect of the invention, an MRI apparatus is provided as follows. The MRI apparatus includes: one pair of static magnetic field generating means disposed sandwiching a space in which a test object is placed; magnetic field generating means configured to apply a high-frequency magnetic field and a gradient magnetic field to the test object placed in the static magnetic field; and receiving means configured to receive a nuclear magnetic resonance signal generated from the test object. The receiving means includes a receiving coil having a predetermined coil pattern and capable of being shaped into a cylinder.

The receiving coil includes flexible parts and rigid parts alternately disposed along the circumference direction when shaped into the cylinder. The flexible parts include a flexible substrate on which a portion of the predetermined coil pattern is mounted and a air-bubbles-containing resin section for covering the both surfaces of the flexible substrate. Using the air-bubbles-containing resin section in this way achieves the windability, light weight and ease in handling of the receiving coil.

For example, the above-described rigid parts include a rigid substrate on which a portion of the predetermined coil pattern is mounted and a case for containing the rigid substrate. For example, fitting sections are formed on the edge of the air-bubbles-containing resin section, the shape of the fitting sections being such that the fitting sections fit to the edge of the case. The fitting sections can be fitted to the case to connect the edges of the flexible parts and the rigid parts. The coil patterns of the rigid substrate and the flexible substrate are electrically connected at the edge at which the flexible parts and the rigid parts are connected. Thus, the rigid substrate and the flexible substrate can be alternately disposed to achieve the predetermined coil pattern.

Also, the thickness of a portion of the air-bubbles-containing resin section positioned on the inner circumference surface side of the flexible parts when shaped into the cylinder can be thinner than a portion of the air-bubbles-containing resin section positioned on the outer circumference surface side. This allows the coil pattern of the flexible substrate to be disposed close to the test object.

Grooves in the direction parallel to the body axis of the test object can be provided in the portion of the air-bubbles-containing resin section positioned on the outer circumference surface side when shaped into the cylinder. Providing the grooves can limit the bending position of the flexible parts to the locations of the grooves. Also, in the portion of the air-bubbles-containing resin section positioned on the inner circumference surface side grooves in the direction parallel to the body axis of the test object can be provided at the positions corresponding to the positions of the grooves on the outer circumference surface side. This allows the receiving coil to bend with a small curvature radius at limited bending positions and to be also applicable to a small-diameter test object. The grooves in the portion of the air-bubbles-containing resin section on the outer circumference surface side can be deeper than the grooves in the portion of the air-bubbles-containing resin section on the inner circumference surface side.

The flexible parts can include a frame embedded in a predetermined area of the portion of the air-bubbles-containing resin section positioned on the outer circumference surface side when shaped into the cylinder. The shape of the frame is such that the longitudinal direction of the frame is along the body axis direction of the test object. Alternatively, two or more frames can be arranged and secured along the body axis direction of the test object. This can limit the bending direction of the flexible parts to the direction perpendicular to the body axis, which allows the receiving coil to be easily wound around the test object and easily handled.

The inside of the frame may not be covered with the air-bubbles-containing resin section and can function as a window through which the flexible substrate is exposed. Electrical circuit components can be mounted on the flexible substrate within the window. This allows the electrical circuit components to be tuned or replaced through the window. Also, a lid for covering the window can be secured to the frame.

Elastic members can be disposed between the fitting sections of the air-bubbles-containing resin section and the case. This can prevent the air-bubbles-containing resin section from being damaged. Elastic members can be disposed between the lid and the air-bubbles-containing resin section also at the positions at which the lid is secured. This allows the lid to be rigidly secured to the frame and the air-bubbles-containing resin in which the frame is embedded.

If the receiving coil is a coil to be wound around the body of the test object, the coil can have notches at the positions corresponding to the armpits of the test object when shaped into the cylinder. Thus, the receiving coil can cover the test object to upper chest and upper back.

Also, the receiving coil can include: a belt-shaped member in which the flexible parts and the rigid parts are alternately disposed; and first and second connecting sections disposed to one end and the other end of the belt-shaped member, respectively, to connect the both ends. As guide members for aligning the first and second connecting sections, one or more guide protrusions can be provided to one of the first and second connecting sections, and guide holes to be engaged with the guide protrusions can be provided to the other. Also, as fitting members for fitting the first connecting section to the second connecting section, one or more first fitting sections and second fitting sections that fit the first fitting sections can be provided. In this case, the one or more guide members and the one or more fitting members can be disposed in alignment. This allows the connecting sections to be difficult to be disconnected by an external force.

The coil pattern of the flexible parts can be divided into two or more portions by one or more slits. The divided coil patterns are electrically connected by capacitors having a predetermined capacitance. The capacitance of the capacitors are considered electrically short-circuited at a frequency of nuclear magnetic resonance signal, and considered electrically open at a frequency of eddy current. This can suppress the generation of eddy current on the coil pattern.

According to a second aspect of the invention, a receiving coil, capable of being shaped into a cylinder, for a magnetic resonance imaging apparatus is provided. The receiving coil includes flexible parts and rigid parts alternately disposed along the circumference direction when shaped into the cylinder. The flexible parts include a flexible substrate on which a portion of the predetermined coil pattern is mounted and a air-bubbles-containing resin section for covering the both surfaces of the flexible substrate.

According to a third aspect of the invention, a method for manufacturing a receiving coil is provided as follows. Flexible parts in which both surfaces of a flexible substrate are covered with an air-bubbles-containing resin section the shape of which corresponds to a predetermined mold is made by disposing a air-bubbles-containing resin member on the both surfaces of the flexible substrate and heating them in the mold to press and heat-seal the air-bubbles-containing resin member, the flexible substrate including a portion of a predetermined coil pattern. The flexible parts and rigid parts including a substrate on which a portion of the predetermined coil pattern is formed are alternately connected to form a shape that can be shaped into a cylinder. Also, grooves to limit the bending position of the flexible parts, spaces for embedding the frames, and the positions of the windows for accessing an internal component to replace the component or tune its characteristic can be individually configured by adjusting the shape of the mold.

According to a fourth aspect of the invention, a receiving coil is provided as follows. The receiving coil is used for a magnetic resonance imaging apparatus, and includes: a belt-shaped member having a predetermined coil pattern; and first and second connecting sections disposed to one end and the other end of the belt-shaped member, respectively, to connect the both ends. As guide members for aligning the first and second connecting sections, one or more guide protrusions are provided to one of the first and second connecting sections, and guide holes to be engaged with the guide protrusions are provided to the other. Also, as fitting members for fitting the first connecting section to the second connecting section, one or more first fitting sections and second fitting sections that fit the first fitting sections are provided. The one or more guide members and the one or more fitting members are disposed in alignment. This allows the connecting sections to be difficult to be disconnected by an external force.

According to a fifth aspect of the invention, a receiving coil is provided as follows. The receiving coil is used for a magnetic resonance imaging apparatus, and has a coil pattern mounted on a substrate, and the coil pattern is divided into two or more portions by one or more slits. The divided coil patterns are electrically connected by capacitors having a predetermined capacitance. The capacitance of the capacitors are set to be considered electrically short-circuited at a frequency of nuclear magnetic resonance signal, and considered electrically open at a frequency of eddy current. This can reduce eddy current generated on the coil pattern, thereby reducing the influence of magnetic field generated by the eddy current on the test object, and preventing the image quality from degrading even when the coil pattern is close to the test object. In totality, the image quality can be improved.

Advantage of the Invention

According to the invention, a receiving coil to be wound around a test object can be provided, the receiving coil being lightweight and flexible.

BRIEF DESCRIPTION OF THE DRAWINGS

FIG. 10(a) A cross-sectional view of the windows 83 of the flexible part 501 shown in FIG. 11.

FIG. 10(b) A cross-sectional view of the flexible part 501 shown in FIG. 10(a) that is bending.

FIG. 12(a-1) A plan view showing a schematic configuration of a flexible substrate 601 shown in FIG. 7.

FIG. 12(a-2) A cross-sectional view along the line A-A in FIG. 12(a-1).

FIG. 12(b-1) A plan view showing a schematic configuration of a rigid substrate 603 according to the embodiment.

FIG. 12(b-2) A cross-sectional view along the line B-B in FIG. 12(b-1).

FIG. 13(a) An illustration showing that slits are inserted in a conductive plate layer of the flexible substrate 601 and capacitors are mounted across the slits.

FIG. 13(b) A schematic circuit diagram showing a circuit equivalent to what is shown in FIG. 13(a).

FIG. 14(a) A perspective view of the flexible substrate 601 according to the embodiment with frames secured thereto.

FIG. 14(b) An illustration showing the step of securing the frames.

FIG. 15 A perspective view of the flexible part 504 and the rigid part 508 connected to each other according to the embodiment.

FIG. 21(a) A perspective view showing the receiving coil shown in FIG. 20 before being fitted to the test object.

FIG. 21(b) A perspective view showing the receiving coil after being fitted to the test object.

FIG. 22 An enlarged perspective view of the grooves 85 provided in both sides of the RE receiving coil shown in FIG. 20.

Figure 1:
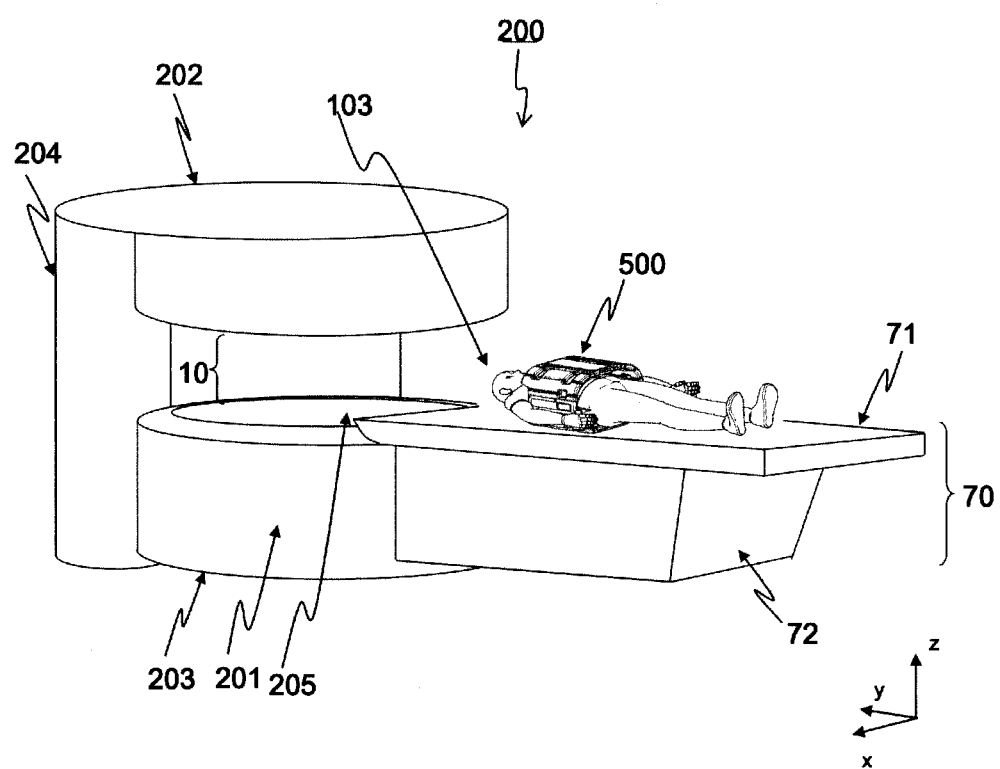
FIG. 1 A perspective view showing a schematic structure of an open-type MRI apparatus that generates a vertical magnetic field according to an embodiment of the invention.

DESCRIPTION OF REFERENCE NUMERALS AND SIGNS 70 bed, 71 top plate, 72 bed chassis, 103 test object, 200 main body of open-type MRI apparatus, 201 one pair of magnets disposed in vertical direction and for generating static magnetic field, 202 upper main body, 203 lower main body, 204 supporting post, 205 table top, 206 gradient magnetic field coil, 207 radiation coil, 208 RF power amplifier, 209 RF pulse generator, 210 sequencer, 211 gradient magnetic field power supply, 212 shim coil, 213 shim power supply, 216 receiving sub-coil, 216-1 solenoid coil, 216-2 saddle-shaped coil, 217 preamplifiers, 218 receivers, 219 calculator, 220 display, 221 storage medium, 500 RF receiving coil (flexible coil), 501 first flexible part, 502 second flexible part, 503 third flexible part, 504 fourth flexible part, 505 first rigid part, 506 second rigid part, 507 third rigid part, 508 fourth rigid part, 509 fifth rigid part, 510 first connector section, 511 second connector section, 512 receiving cables, 513 levers, 514 connectors, 515 guide pins, 601 flexible substrate, 601a slits of conductive plates, 601-1 first cover film layer, 601-2 first adhesive layer, 601-3 first conductive plate layer, 601-4 second adhesive layer, 601-5 base film layer, 601-6 third adhesive layer, 601-7 second conductive plate layer, 601-8 fourth adhesive layer, 601-9 second cover film layer, 601-10 through holes for connecting first and second conductive plate layers, 602 air-bubbles-containing resin, 603 rigid substrate, 603a slits of conductive plate traces, 603-1 first conductive plate layer, 603-2 second conductive plate layer, 603-3 through holes for connecting first and second conductive plate layers, 603-4 first adhesive layer, 603-5 substrate, 603-6 second adhesive layer, 604 resin case, 605 upper screws, 606 resin caps, 607 lids, 608 heat-resistant resin frames, 609 heat-resistant resin bases, 700 rubber packings, 802-1 to 802-8 large-capacitance capacitor

MODE FOR CARRYING OUT THE INVENTION

Embodiments of the invention are described below in detail with reference to the drawings.

First Embodiment

First, an entire configuration of an MRI apparatus according to a first embodiment is described with reference to a perspective view and a block diagram shown in FIGS. 1 and 2, respectively. As shown in FIG. 1, the MRI apparatus includes a main body 200 and a bed 70. The main body 200 includes an imaging space 10 in which a test object 103 is imaged. The bed 70 carries the test object 103 into the imaging space 10.

The main body 200 includes an upper main body 202 disposed on the upper side of the imaging space 10, an lower main body 203 disposed on the lower side of the imaging space 10, and an supporting post 204 for coupling the upper and lower main bodies 202 and 203. As shown in FIG. 2, each of the upper and lower main bodies 202 and 203 includes a magnet 201, and includes a shim coil 212, a gradient magnetic field coil 206 and an RF radiation coil 207 disposed in order on the test object 103 side of the magnet 201.

The pair of magnets 201 generate a static magnetic field in the imaging space 10 and may be a permanent magnet, a normal conducting magnet or a super conducting magnet. The shim coil 212 is a coil that generates a magnetic field for correcting the static magnetic field to improve the static magnetic field uniformity. As shown in FIG. 2, the shim coil 212 is connected to a shim power supply 213 that supplies a predetermined shim current.

In order to add location information to a nuclear magnetic resonance signal and for other purposes, the gradient magnetic field coil 206 generates in the imaging space 10 a gradient magnetic field relating to directions of orthogonal three axes (x-, y- and z-axes) of the imaging space 10. As shown in FIG. 2, the gradient magnetic field coil 206 is connected to a gradient magnetic field power supply 211 that supplies a predetermined gradient magnetic field current.

Figure 2:
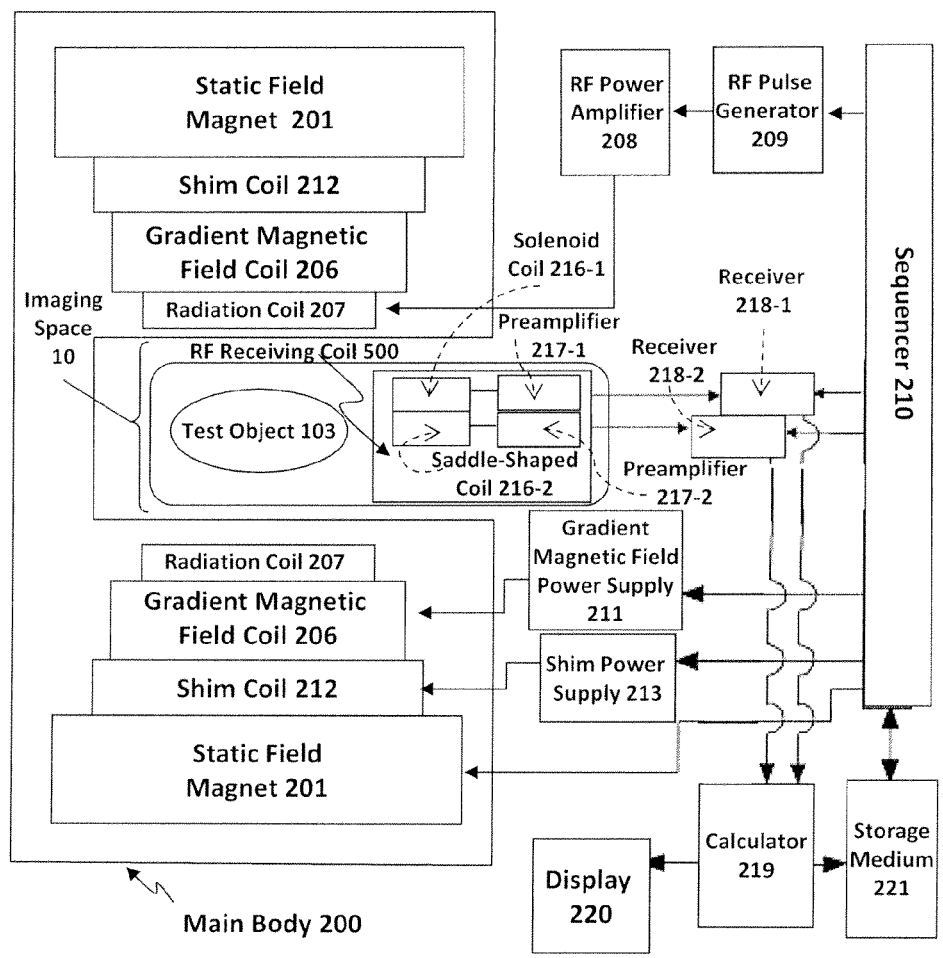
FIG. 2 A block diagram showing a configuration of the MRI apparatus according to the embodiment.

As shown in FIG. 2, the RF radiation coil 207 is connected to an RF power amplifier 208 and an RF pulse generator 209. The RF pulse generator 209 generates an RF signal with a predetermined frequency that is amplified by the RF power amplifier 208 and provided to the RF radiation coil 207. Then, the RF radiation coil 207 generates a high-frequency magnetic field that excites the nuclear magnetization of the test object 103.

An RF receiving coil 500 is disposed in proximity to the test object 103 in the imaging space 10. The RF receiving coil 500 according to the embodiment can be wound around the test object 103 and has a shape that closely fits the test object 103.

Figure 3:
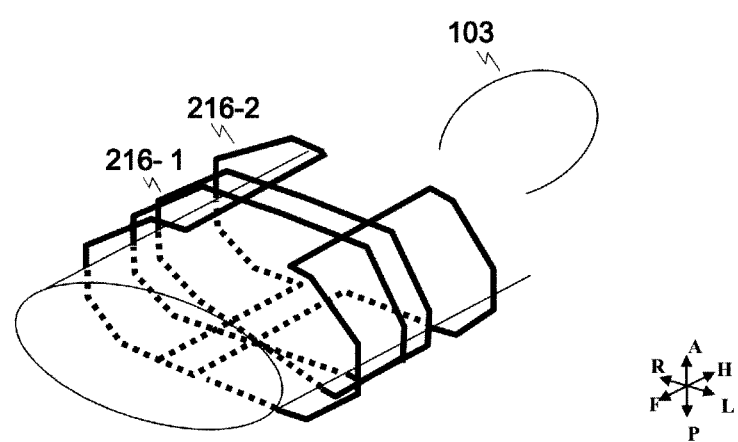
FIG. 3 An illustration showing a coil pattern of an RF receiving coil according to the embodiment when fitted to a test object.
Figure 4:
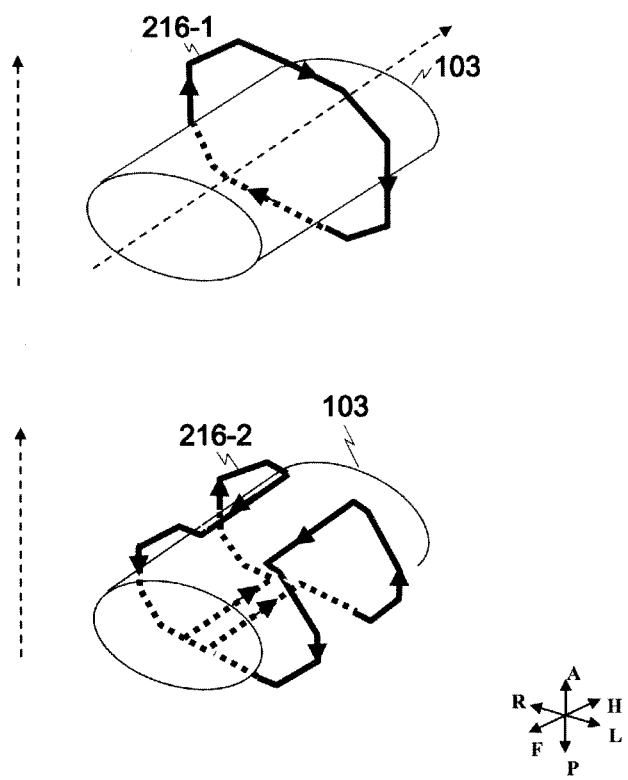
FIG. 4 An illustration showing directions in which high-frequency currents flow and directions of magnetic field components for each coil when the RF receiving coil according to the embodiment is operating.

The RF receiving coil 500 receives the nuclear magnetic resonance signal generated from the test object 103 and converts the received signal into an electrical signal. As shown in FIG. 3, the RF receiving coil 500 according to the embodiment includes a solenoid coil 216-1 for detecting a magnetic field in the direction parallel to the body axis and a saddle-shaped coil 216-2 for detecting a magnetic field in the body width direction. FIG. 3 schematically illustrates the shapes of the solenoid coil 216-1 and the saddle-shaped coil 216-2 when the RF receiving coil 500 is wound around the test object 103. For each of the solenoid coil 216-1 and the saddle-shaped coil 216-2, FIG. 4 shows the shape of the coil and the direction of current that flows when a magnetic field shown by an arrow is applied.

As shown in FIG. 2, the RF receiving coil 500 includes preamplifiers 217-1 and 217-2 for amplifying the signals received by the solenoid coil 216-1 and the saddle-shaped coil 216-2, respectively. The preamplifiers 217-1 and 217-2 are connected to receivers 218-1 and 218-2, respectively, for detecting the amplified received signals.

The receivers 218-1 and 218-2 are connected to a calculator 219 that performs image reconstruction and the like on the received signals. The reconstructed images are displayed on a display 220 connected to the calculator 219 and also stored in a storage medium 221.

Also, as shown in FIG. 2, the MRI apparatus includes a sequencer 210. The sequencer 210 controls the operation of the RF pulse generator 209, the receivers 218-1 and 218-2, the gradient magnetic field power supply 211, the shim power supply 213 and the magnet 201 (when it is a normal conducting magnet) to perform an imaging pulse sequence of irradiating the test object 103 with a gradient magnetic field and a high-frequency magnetic field pulse at a predetermined timing, and receiving a generated nuclear magnetic resonance signal at a predetermined timing.

As shown in FIG. 1, the bed 70 includes a top plate 71 for carrying the test object 103 and a bed chassis 72. The bed chassis 72 includes an actuator for actuating the top plate 71 to a table top 205 on the top surface of the lower main body 203. The test object 103, around which the RF receiving coil 500 is wound, is put on the top plate 71 and carried onto the table top 205 to be positioned in the imaging space 10.

The structure of the RF receiving coil 500 is described below in detail.

As shown in FIG. 5(a), the RF receiving coil 500 has a strip-shaped structure in which five rigid parts 505, 506, 507, 508, 509 and four flexible parts 501, 502, 503, 504 are alternately disposed and connected. Each of the five rigid parts 505, 506, 507, 508, 509 includes a rigid substrate on which a predetermined conductive traces are formed.

Each of the four flexible parts 501, 502, 503, 504 includes a flexible substrate on which a predetermined conductive traces are formed. In connecting sections between the rigid parts and the flexible parts, the internal rigid substrates and the internal flexible substrates are mechanically and electrically connected to configure a coil pattern of the solenoid coil 216-1 and the saddle-shaped coil 216-2, as shown in FIG. 5(b).

Figure 6:
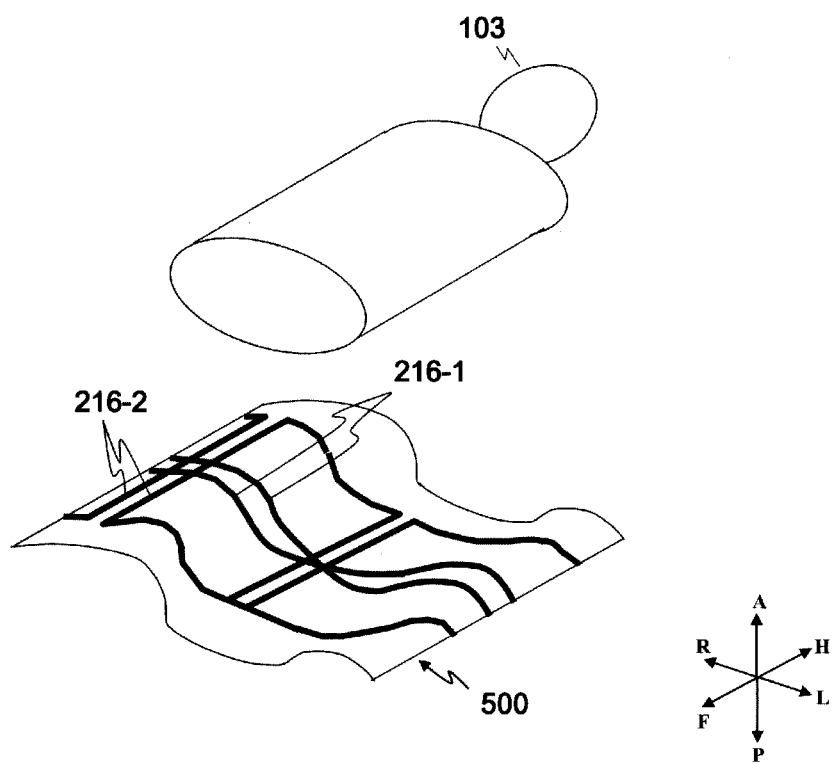
FIG. 6 An illustration showing the coil pattern of the RF receiving coil according to the embodiment with the connector sections disconnected.

The first rigid part 505 located at one edge includes a first connector section 510 at that edge, and the fifth rigid part 509 located at the other edge includes a second connector section 511 at that edge. The first and second connector sections 510 and 511 are formed so as to fit with each other. As shown in FIG. 6, when the first connector section 510 is not fitted with the second connector section 511, the RF receiving coil 500 is strip-shaped and then can be inserted between the test object 103 and the top plate 71 of the bed 70.

With the RF receiving coil 500 inserted in this way, fitting the first connector section 510 with the second connector section 511 allows the RF receiving coil 500 to be wound around and closely fitted to the test object 103 as shown in FIG. 3.

Next, a structure and manufacturing procedure of the first to fourth flexible parts 501 to 504 is described. Since the flexible parts 501 to 504 have the same structure, the flexible part 501 is described here with reference to FIGS. 7 to 10.

Figure 7:
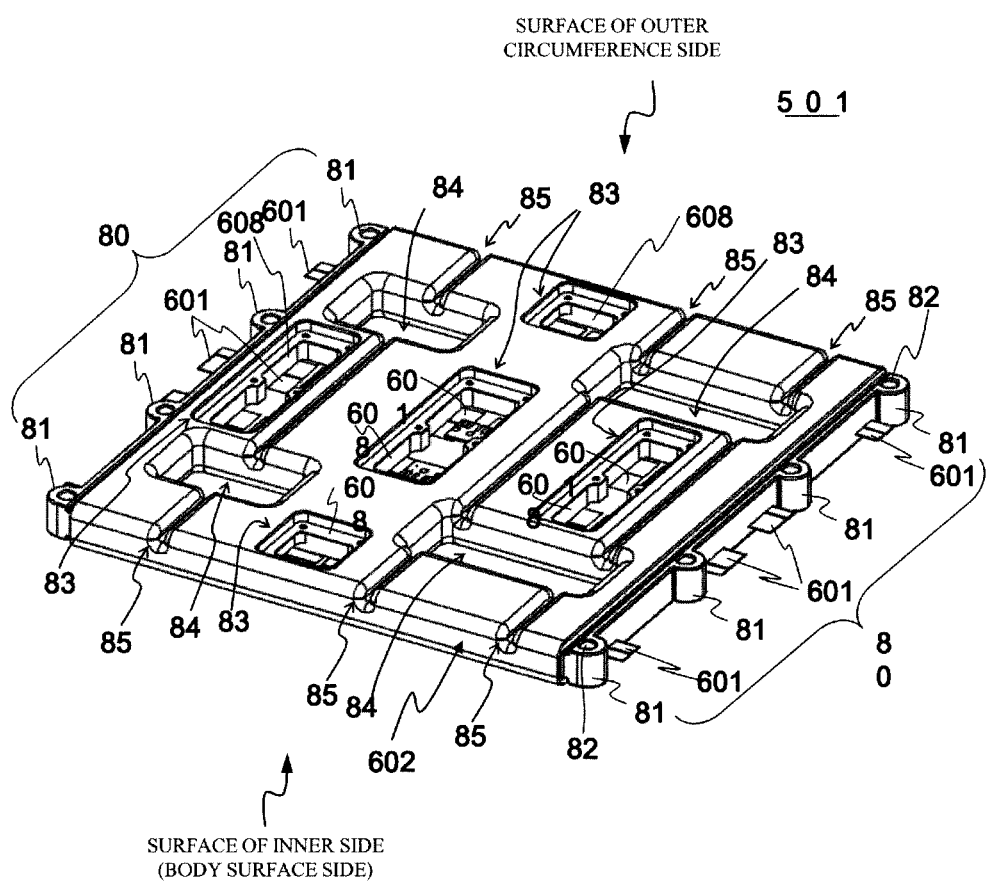
FIG. 7 A perspective view of a flexible part 501 of the RF receiving coil according to the embodiment.

As shown in FIG. 7, a perspective view, the flexible part 501 includes a flexible substrate 601 on which conductive traces are formed, the both surfaces of which are covered with an air-bubbles-containing resin 602 such as foam material. In order to connect the flexible part 501 to the adjacent rigid parts 505, 506, fitting sections 81 are formed of the air-bubbles-containing resin 602 at connecter edges 80. In the fitting sections 81, holes 82 passing through the air-bubbles-containing resin 602 and the flexible substrate 601 are provided. Also in the connecter edges 80, the edges of the flexible substrate 601 are exposed. The exposed edges of the flexible substrate 601 are electrically and mechanically connected to a rigid substrate 603 of the rigid parts 505 and 506.

Also, the air-bubbles-containing resin 602 is thinly provided on the side of the surface facing to the test object 103 (body surface side) of the flexible substrate 601, and is thickly provided on the outer side (outer circumference side when wound around the test object 103) of the flexible substrate 601. This allows the conductive traces of the flexible substrate 601 to be located closer to the test object 103.

Figure 8:
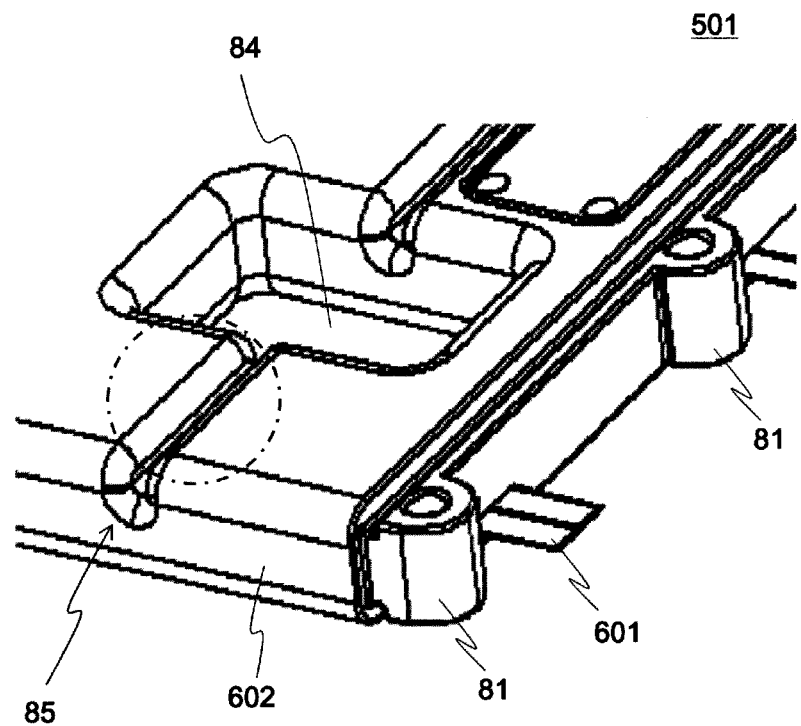
FIG. 8 An enlarged view of grooves 85 of the flexible part 501 shown in FIG. 7.

As shown in FIGS. 7 and 8, in the surface of the outer circumference side of the air-bubbles-containing resin 602, two more grooves 85 are provided along the body axis direction of the test object 103. With the grooves 85 provided, when the RF receiving coil 500 is bent, the flexible part 501 bends at the grooves 85.

This allows the flexible part 501 to bend only at the grooves 85. The flexible substrate 601 bends at the positions outside the areas on which electrical circuit components 91 such as tuning capacitor are mounted, which can protect the electrical circuit components 91.

Preferably, the depth of the grooves 85 is determined so that the remaining thickness after subtracting the depth of the groove 85 from the thickness of the air-bubbles-containing resin 602 is equal to or less than the thickness of the rigid parts 505 to 509 and is also more than about 15 mm. This allows the flexible parts 501 to 504 to be flexible while maintaining their strength.

Also, two or more windows 83 are provided on the air-bubbles-containing resin 602 to expose portions of the flexible substrate 601. On the portions of the flexible substrate 601 exposed through the windows 83, the electrical circuit components 91 such as tuning capacitor are mounted as shown in an enlarged perspective view in FIG. 9.

Then, an operator can adjust or replace the electrical circuit components 91 through the windows 83.

Figure 9:
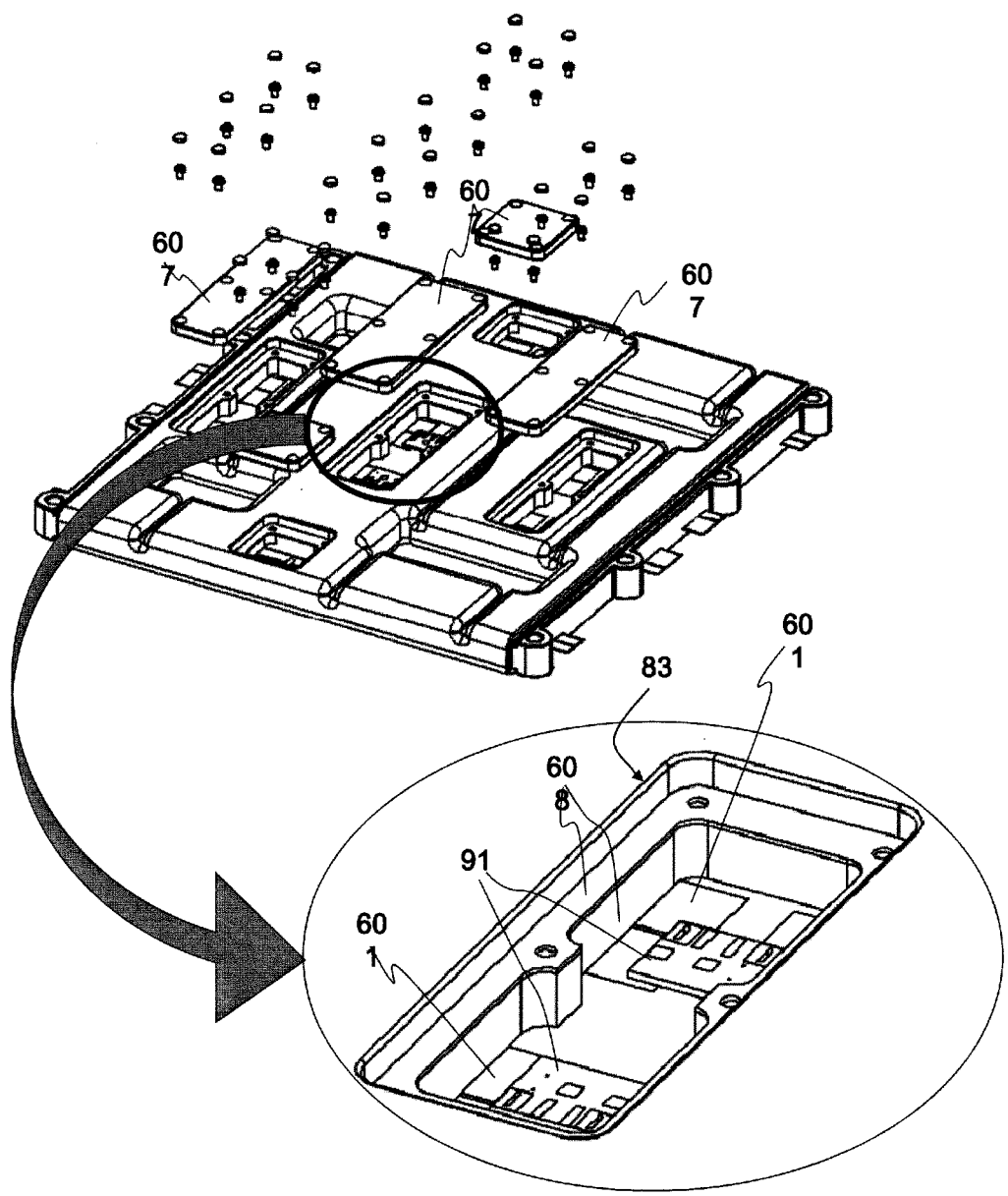
FIG. 9 An enlarged perspective view of windows 83 of the flexible part shown in FIG. 7.
Figure 1:
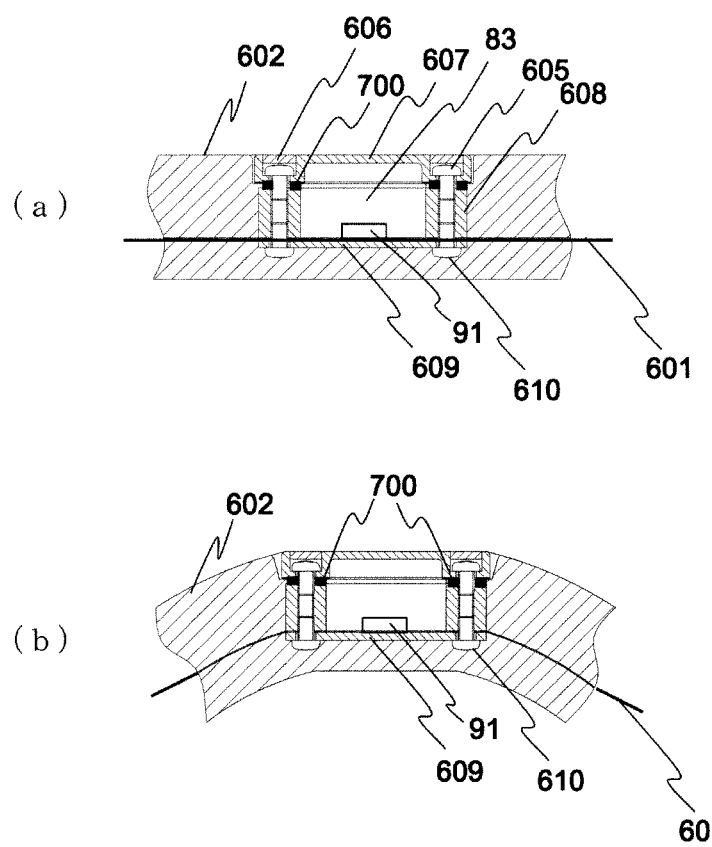
Figure 11:
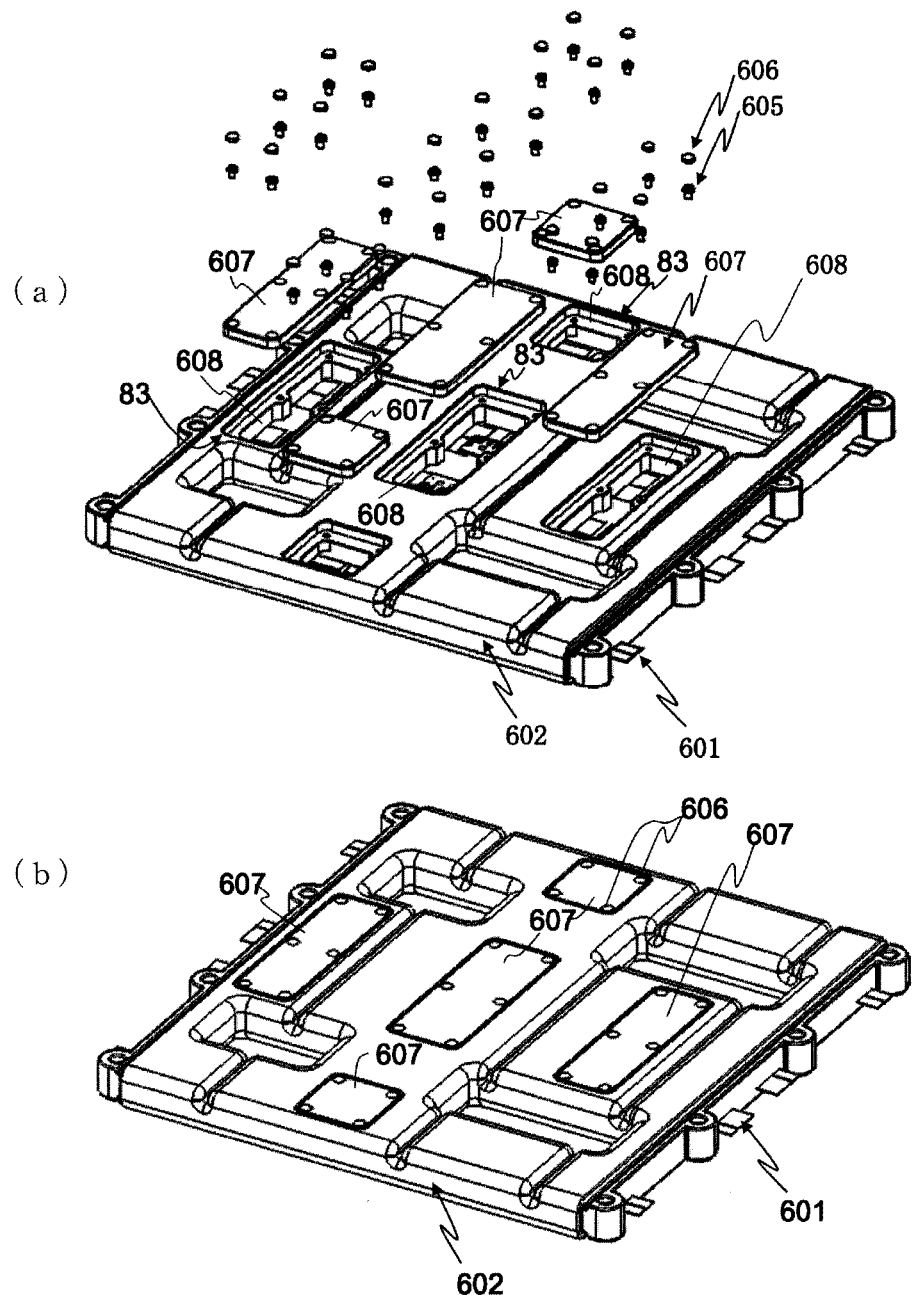
FIG. 11(a) An illustration showing the step of securing lids to the flexible part shown in FIG. 7 with screws.
FIG. 11(b) A perspective view of the completed flexible part.
Figure 1:
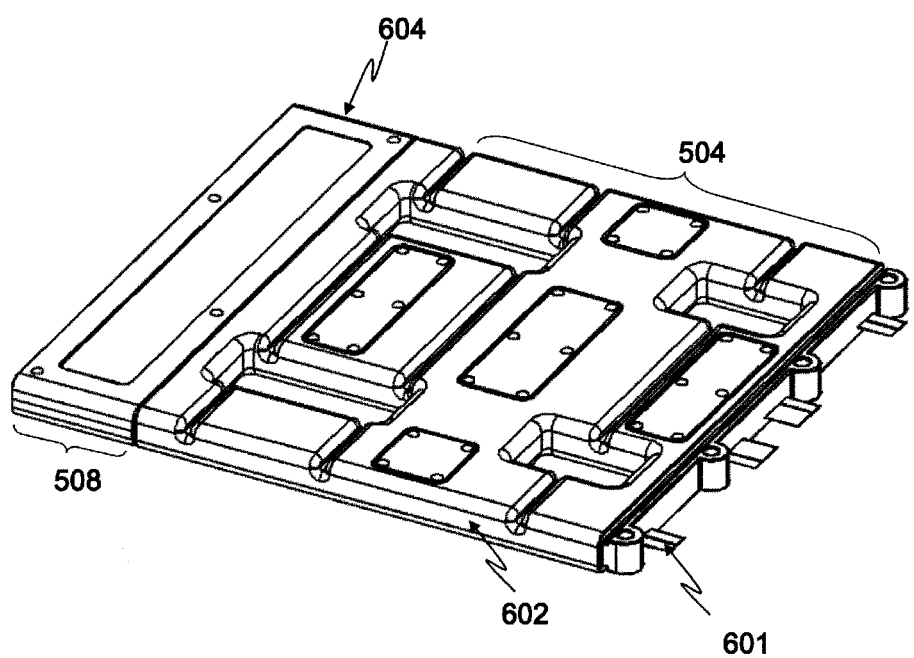

As shown in FIGS. 7 and 9, rigid frames 608 are embedded in the periphery of the windows 83. As shown in FIG. 10(a), the frames 608 are secured to the flexible substrate 601 by screws 610, and then, the frames 608 and the screws 610 are integrally thermoformed and embedded in the air-bubbles-containing resin 602. Also, as shown in FIGS. 10(a), 11(a) and 11(b), rigid lids 607 are secured to the frames 608 by screws 605. The screw holes of the lids 607 are covered by resin caps 606 after the screws 605 are secured. Since the frames 608 and the lids 607 are secured to the flexible substrate 601 in this way, the flexible part 501 does not bend at the windows 83 as shown in FIG. 10(b), even when the flexible part 501 bends at any position other than the grooves 85. This allows the electrical circuit components 91 secured in the windows 83 to be protected.

Also, as shown in FIG. 10(a), rubber packings 700 are disposed between the top surface of the air-bubbles-containing resin 602 integrally formed on the top surface of the frames 608 and the bottom surface of the lids 607. The disposed rubber packings 700 allows the lids 607 to be rigidly secured to the frames 608 and the air-bubbles-containing resin 602 integrally formed on the frames 608, increasing the strength of the frames 608. Accordingly, even when the flexible part 501 bends at any position other than the grooves 85 as shown in FIG. 10(b), the electrical circuit components 91 can be protected.

Also, as seen from FIG. 7, in the embodiment, the shape of the frames 608 is such that the longitudinal direction of the frames 608 is along the body axis direction of the test object 103, and/or the two or more frames 608 are arranged in the body axis direction. This allows the shape of the flexible part 501 to be such that the flexible part 501 is easy to bend in the circumference direction of the test object 103 and is difficult to bend in the body axis direction. Limiting the bending direction of the flexible part 501 to the circumference direction allows the RF receiving coil to be easily wound around and easily fitted to the test object 103.

As shown in FIGS. 12(a-1) and 12(a-2), the flexible substrate 601 is configured by sticking first and second conductive plate layers 601-3 and 601-7 to both surfaces of a base film 601-5 made of a resin using adhesive layers 601-4 and 601-6. As shown in FIG. 12(a-2), the first and second conductive plate layers 601-3 and 601-7 are electrically connected via through holes 601-10 at the edges of the flexible substrate 601.

As shown in FIG. 12(a-1), the first and second conductive plate layers 601-3 and 601-7 are formed with four parallel traces. As apparent from FIG. 5, the conductive traces formed on the flexible parts 501, 502, 503, 504 are two parallel conductive traces forming a part of the solenoid coil 216-1 and two parallel conductive traces forming a part of the saddle-shaped coil 216-2. These conductive traces are formed with the four parallel traces shown in FIG. 12(a-1). Note that the shape of the trace of the second conductive plate layer 601-7 is the same as that of the first conductive plate layer 601-3.

The four parallel traces of the first and second conductive plate layers 601-3 and 601-7 are divided by areas corresponding to the windows 83, and mounting areas 86 for mounting the electrical circuit components 91 are provided at the divided edges. The first and second conductive plate layers 601-3 and 601-7 are electrically connected via the through holes 601-10 also at the mounting areas 86. Frame securing holes 87 for securing the frames 608 with the screws 610 are provided on the base film 601-5 around the windows 83.

As shown in FIG. 12(*a*-2), the first and second conductive plate layers 601-3 and 601-7 are covered with cover film layers 601-1 and 601-9 via adhesive layers 601-2 and 601-8 except the mounting areas 86. This increases the electrical reliability.

As shown in FIG. 12(*a*-1), openings 84 and through holes 92 are provided in portions of the base film 601-5 in which the first and second conductive plate layers 601-3 and 601-7 are not disposed. As shown in FIG. 7, the air-bubbles-containing resin 602 is not disposed on the openings 84 to save the weight of the flexible part 501. On the other hand, the through holes 92 are provided for the purpose of increasing the degree of adhesion of the air-bubbles-containing resin 602 of the surface of the outer circumference side and the air-bubbles-containing resin 602 of the surface of the body surface side.

Slits 601*a* are provided in the traces of the conductive plate layers 601-3 and 601-7. As shown in FIG. 13(*a*), the conductive plate layers 601-3 and 601-7 divided by the slits 601 are electrically connected by capacitors 802-1 to 802-8 having a large capacitance.

Specifically, these capacitors (for example, 1000 pF) are considered electrically short-circuited at a high frequency (for example, 50 MHz) of nuclear magnetic resonance signal, and are considered electrically open at a low frequency. When the capacitors 802-1, etc. are disposed in this way, the conductive plate layers 601-3, etc. become equivalent to the circuit shown in FIG. 13(*b*), in which a high-frequency nuclear magnetic resonance signal can flow in the conductive plate layer 601-3 as in the case without the slits 601*a*, but a low-frequency eddy current cannot flow across the slits 601*a*. This can suppress the generation of the eddy current without interfering with receiving the nuclear magnetic resonance signal.

Since the receiving coil 500 is flexible, it is fitted to the test object 103. So, when eddy current is generated in the conductor of the receiving coil 500, the magnetic field generated by the eddy current interferes with the magnetization of the test object 103. This may cause, for example, the image to be partially darkened, degrading the image quality. In the embodiment, the slits 601*a* and the capacitor 802-1, etc. can prevent eddy current from being generated in the conductor of the receiving coil.

As an example of the base film 601-5, polyimid film with a thickness of 25 μm may be used. As an example of the conductive plate layers 601-3 and 601-7, a copper plate with a thickness of 35 μm may be used.

The air-bubbles-containing resin 602 may be any resin containing many air bubbles therein. As an example, a foamable resin may be used. As an example of the foamable resin, polyethylene, polyuretane, boron or rubber sponge may be used. As an example of method for foaming, chemical foaming method may be used. The apparent density of the air-bubbles-containing resin 602 is desirably equal to or less than 0.1 g/cm$^3$.

Next, a procedure for manufacturing the flexible part 501 is described. First, the conductive plate layers 601-3 and 601-7 having a predetermined shape are stuck to both surfaces of the base film using the adhesive layers 601-4 and 601-6. Then, the through holes 601-10 are provided, and the conductive plate layers 601-3 and 601-7 are connected. Then, the cover film layers 601-1 and 601-9 are stuck to the conductive plate layers 601-3 and 601-7 using the adhesive layers 601-2 and 601-8 except the mounting areas 86.

The fitting section through holes 82, the openings 84, the frame securing holes 87 and the through holes 91 are provided in the base film 601-5. At this time, the flexible substrate 601 is completed.

Next, the frames 608 and bases 609 are disposed on the outer circumference surface side and the body surface side of the flexible substrate 601, respectively, and secured with the screws 610 as shown in FIGS. 14 (*a*) and 14(*b*). Then, on both surfaces of the flexible substrate 601, a resin sheet that is the material of the air-bubbles-containing resin 602 is disposed. Then, the flexible substrate 601 is heated in a mold having a predetermined shape. This causes the resin sheet to foam to be the air-bubbles-containing resin 602 and be shaped into the shape shown in FIG. 7. Through the windows 83, the electrical circuit components 91 are mounted on the mounting areas 86. Then, the rubber packings 700 are disposed on the top surface of the air-bubbles-containing resin 602 that is integrated with the top surface of the frames 608. Then the lids 607 are secured with the screws 605. Caps 606 are attached to the screw holes. At this time, the flexible part 501 is completed.

Next, a configuration and manufacturing procedure of the rigid parts 505-509 is described.

Figure 16:
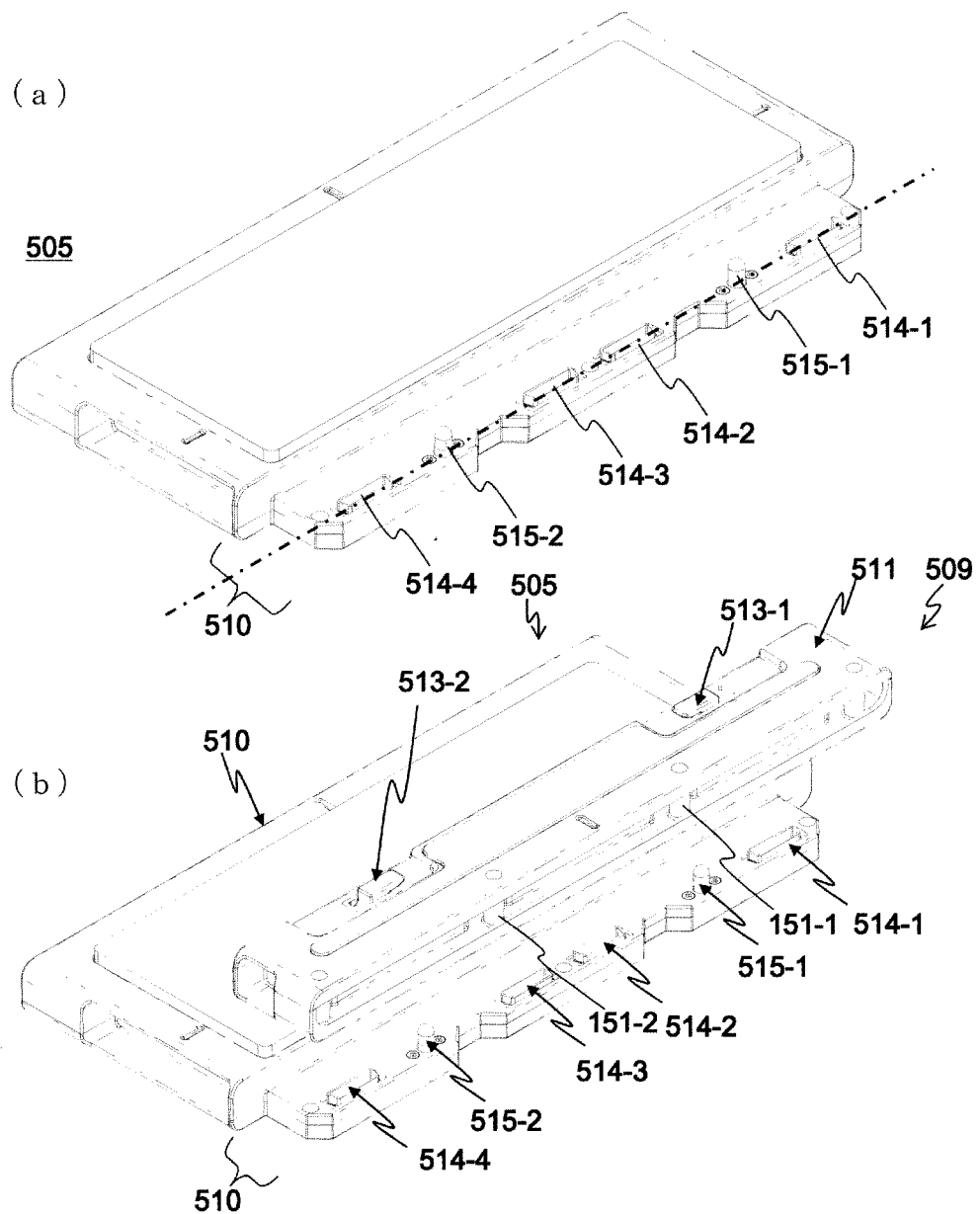
FIG. 16(a) A perspective view of the rigid part 505 of the RF receiving coil according to the embodiment.
FIG. 16(b) A perspective view of a connector section 510 and a connector section 511 of the rigid part 505.

The rigid parts 505, 506, 507, 508, 509 have a structure in which the rigid substrate 603 as shown in FIG. 12(*b*-1) is disposed in a rigid resin case 604. For the rigid parts 506, 507, 508, the outer shape of the resin case 604 is a rectangular parallelopiped as shown in FIG. 15. The resin case 604 of the rigid part 505 includes the first connector 510 at the edge as shown in FIG. 16(*a*). The resin case 604 of the rigid part 509 includes the second connector 511 having the shape as shown in FIG. 16(*b*) at the edge. The first connector 510 fits the second connector 511.

As shown in FIG. 12(*b*-2), the rigid substrate 603 is configured by securing conductive plate layers 603-1 and 603-2 to both surfaces of a substrate 603-5 made of a rigid material (e.g., glass epoxy resin) using adhesive layers 603-4 and 603-6. The conductive plate layers 603-1 and 603-2 are connected via through holes 603-3. Traces of the conductive plate layers 603-1 and 603-2 includes traces for forming the solenoid coil 216-1 and traces for forming the saddle-shaped coil 216-2. The conductive plate layer 603-1 forming the saddle-shaped coil 216-2 includes connecting sections 131*a* to 131*f*. The conductive plate layer 603-1 forming the solenoid coil 216-1 includes connecting sections 132*a* to 132*d*. By connecting these connecting sections in an appropriate combination using bridge-like connecting components (not shown), the coil patterns of the rigid parts 505 to 509 can be formed.

Also, by connecting the connecting sections 131*a*, 131*b* and 131*c* and connecting the connecting sections 131*d*, 131*e* and 131*f*, the coil patterns of the saddle-shaped coil 216-2 of the rigid part 505 can be formed. Also, by connecting the connecting sections 132*a* and 132*b* and connecting the connecting sections 132*c* and 132*d*, the coil patterns of the solenoid coil 216-1 of the rigid part 505 can be formed. For the rigid part 507, the coil pattern of the saddle-shaped coil 216-2 is formed by connecting the connecting sections 131*a*, 131*b* and 131*c* and connecting the connecting sections 131*d*, 131*e* and 131*f*, and a noncontact crossing section of the 2-turn solenoid coil 216-1 is formed by diagonally connecting the connecting sections 132*a* and 132*d* and diagonally connecting the connecting sections 132*b* and 132*c*.

Since the rigid substrate 603 is used in each of the rigid parts 505 to 509, the solenoid coil 216-1 and the saddle-shaped coil 216-2 can intersect with a predetermined distance (a few millimeters) maintained therebetween by using bridge-like connecting component. This separation can prevent the two coil systems from being electromagnetically coupled.

Also, as shown in FIG. 12(*b*-1), slits 603*a* are formed in the conductive plate layer 603-1. As in the case shown in FIG. 13(*a*), capacitors having a large capacitance are disposed on the slits 603*a* and prevent eddy current from being generated.

Figure 5:
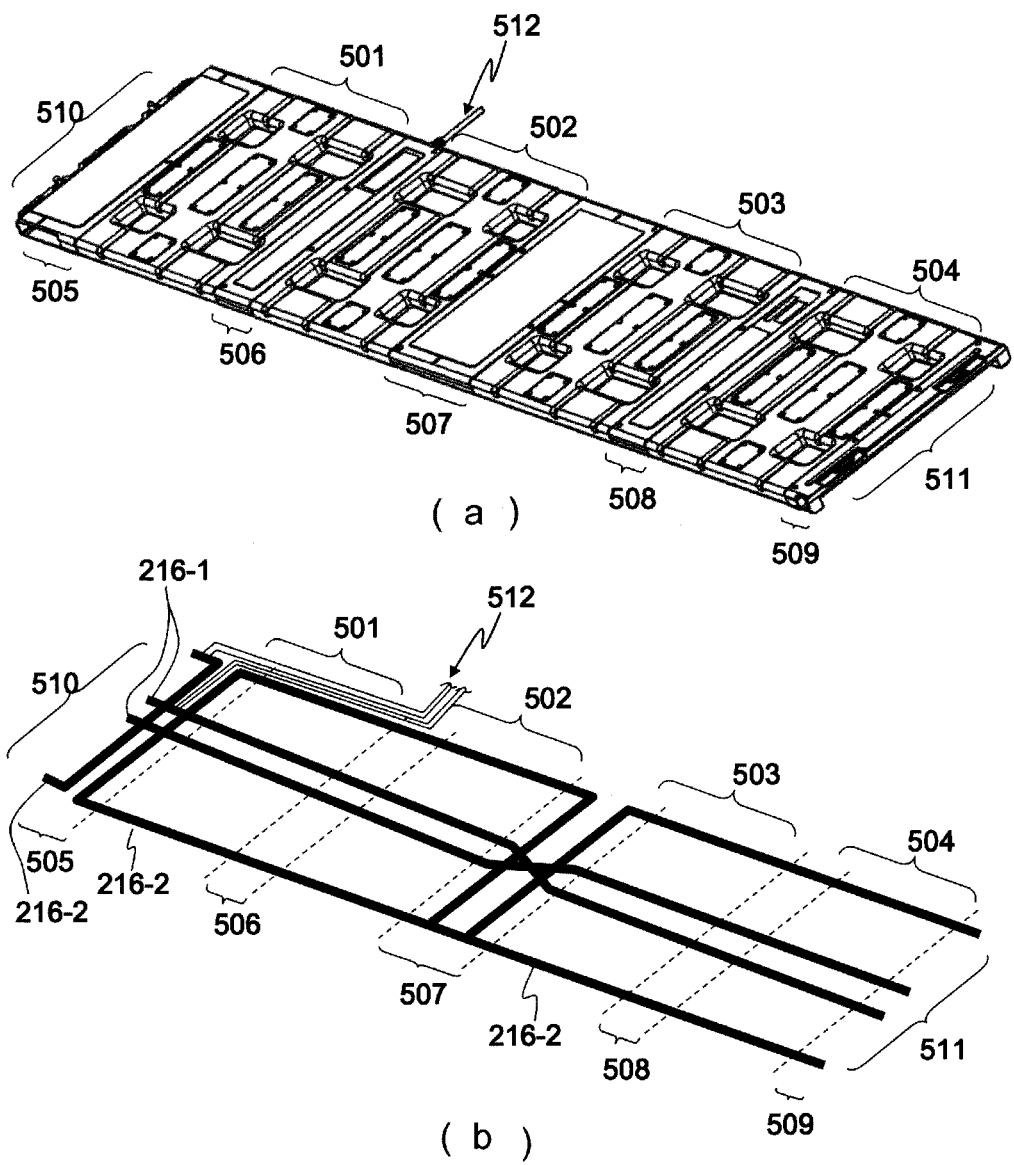
FIG. 5(a) A perspective view showing the RF receiving coil according to the embodiment with the connector sections disconnected.
FIG. 5(b) An illustration showing the coil pattern in the state shown in FIG. 5(a).

As shown in FIG. 5(*b*), receiving cables 512 are connected to the solenoid coil 216-1 and the saddle-shaped coil 216-2 of the rigid part 505 for outputting received signals from the coils. The receiving cables 512 are lead out from the rigid part 505 through the flexible part 501, as shown in FIG. 5(*b*).

When manufacturing the rigid parts 505, etc., the conductive plate layers 603-1 and 603-2 having a predetermined pattern are stuck to both sides or one side of the substrate 603-5 using the adhesive layers 603-4 and 603-6, then through holes 603-10 are formed to connect the both conductive plate layers 603-1 and 603-2, as shown in FIGS. 12 (*b*-1) and 12(*b*-2). Then, an electrical circuit component such as a capacitor and decoupler is mounted as appropriate.

Figure 17:
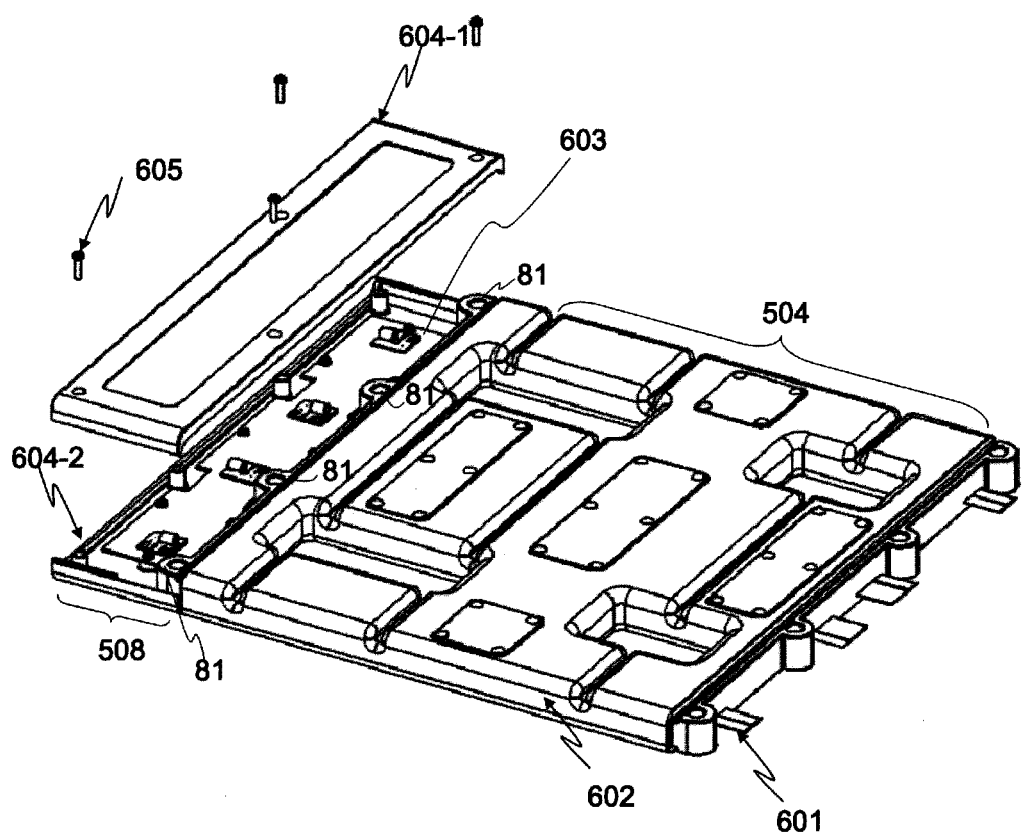
FIG. 17 An illustration showing the step of connecting the flexible part 504 and the rigid part 508 shown in FIG. 15.
Figure 18:
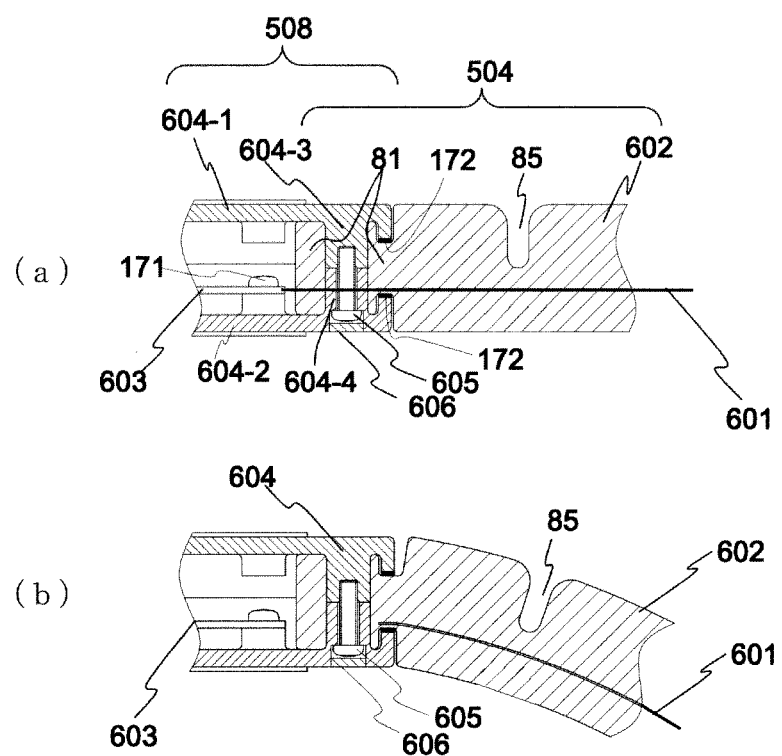
FIG. 18(a) A cross-sectional view of the connection of the flexible part 504 and the rigid part 508 shown in FIG. 15.
FIG. 18(b) A cross-sectional view of the flexible part 501 shown in FIG. 18(a) that is bending.

The rigid substrate 603 is disposed in the resin case 604 as shown in FIG. 17. The case 604 is divided into an outer circumference surface side member 604-1 and a body surface side member 604-2. As shown in FIG. 18(*a*), the rigid substrate 603 is secured in the body surface side member 604-2 using screws 171. The outer circumference surface side member 604-1 and the body surface side member 604-2 include protrusions 604-3 and 604-4, respectively, that fit the fitting sections 81 of the adjacent flexible part 504, etc. by being inserted into the holes 82 of the fitting sections 81. The protrusions 604-4 of the body surface side member 604-2 are fitted to the fitting sections 81 of the flexible part 504, etc. The edge of the rigid substrate 603 is soldered to the edge of the flexible substrate 601 to electrically connect the coil patterns. Then, the outer circumference surface side member 604-1 is put over the rigid substrate 603. Then, the protrusions 604-3 are fitted to the fitting sections 81 and secured with the screws 605. At this time, the rigid parts 505 to 509 can be made and also connected to the adjacent flexible parts 501 to 504.

Note that, as shown in FIG. 18(*a*), rubber packings 172 are disposed in a fitting section at which the edge of the resin case 604 is fitted to the air-bubbles-containing resin 602 of the flexible parts 501 to 504. This rubber packings 172 can prevent the air-bubbles-containing resin 602 from being damaged at the fitting section with the resin case 604 even when the flexible part 501 or the like bends at any position other than the grooves 85 as shown in FIG. 18(*b*).

Next, the shape of the connector sections is described.

In the embodiment shown in FIG. 16(*b*), the first connector section 510 of the rigid part 505 and the second connector section 511 of the rigid part 509 are detachably engaged to shape the RF receiving coil 500 into a cylinder to be wound around the test object 103 and to connect each of the coil 38 patterns of the solenoid coil 216-1 and the saddle-shaped coil 216-2.

As shown in FIG. 16(*a*), guide pins 515-1 and 515-2 are provided in the first connector section 510, and guide holes 151-1 and 151-2 are provided in the second connector section 511. By engaging the guide pins in the guide holes, the first connector section 510 and the second connector section 511 can be disposed at the position at which they can be connected. In the first connector section 510, four female connectors 514-1 to 514-4 are disposed aligned with the guide pins 515-1 and 515-2. In the second connector section 511, male connectors (not shown) that fit these female connectors are disposed. Thus, the first connector section 510 can be fitted to the second connector section 511 by fitting the female connectors 514-1 to 514-4 to the male connectors while being aligned by the guide pins. Also, the first connector section 510 can be released from the second connector section 511 by operating levers 513-1 and 513-2 provided in the second connector section 511.

Figure 19:
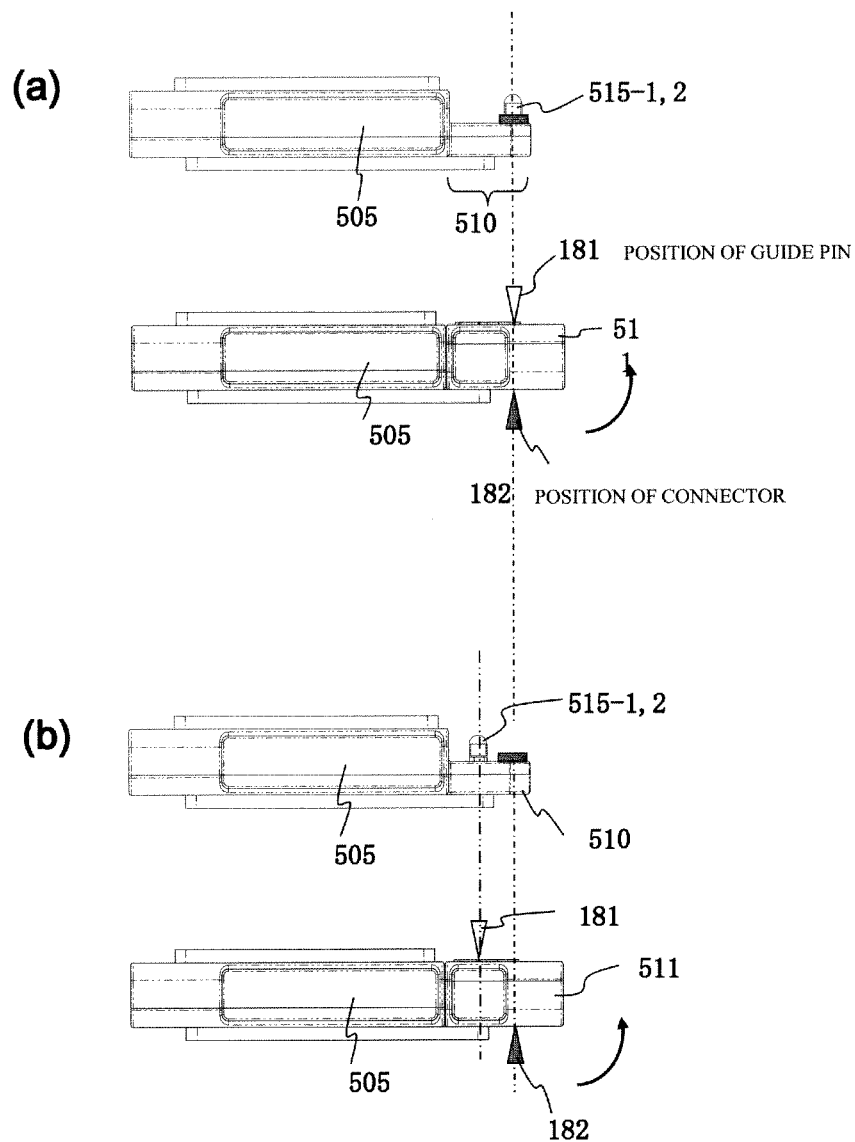
FIG. 19(a) An illustration showing the positional relationship of connectors and guide pins disposed in alignment in connecting sections (locking sections) according to the embodiment.
FIG. 19(b) An illustration showing the positional relationship of connectors and guide pins in connecting sections (locking sections) of a comparison example.

Advantageously, the connector sections 510 and 511 shown in FIGS. 16(*a*) and 16(*b*) can be connected rigidly because the guide pins 515-1 and 515-2 and the connectors 514-1 to 514-4 are disposed in alignment. Specifically, as shown in FIG. 19(*a*), even when an external force is applied in the direction shown by an arrow, the position 181 of the guide pins 515-1 and 515-2 and the position 182 of the connectors 514-1 to 514-4 are in alignment, the point of which can be used as supporting point for supporting the external force, rigidly connecting the connector sections 510 and 511 while preventing them from being displaced. On the other hand, as an comparison example, as shown in FIG. 19(*b*), when the position 181 of the guide pins 515-1 and 515-2 is not aligned with the position 182 of the connectors 514-1 to 514-4, the supporting point is the position 182 of the connector 514-1, then the external force is obliquely applied to the guide pins 515-1 and 515-2. So, the guide pins 515-1 and 515-2 are easily displaced from the guide holes 151-1 and 151-2, then the external force cannot be supported. In this case, the connection is not so rigid as that shown in FIG. 19(*a*).

As described above, in the embodiment, the RF receiving coil 500 to be wound around the test object 103 has a structure in which the flexible parts and the rigid parts are alternately disposed and the flexible substrate in each of the flexible parts is covered with the air-bubbles-containing resin 602. This structure achieves the flexibility, light weight and ease in handling of the RF receiving coil 500, which reduces the stress on the test object, and also allows the operator to easily fit the RF receiving coil 500 to the test object. Furthermore, the RF receiving coil 500 can be closely fitted to the test object, which can increase the received signal level to improve the image quality.

Also, providing the grooves 85 in the flexible parts 501 to 504 can limit the bending position to the locations of the grooves 85, which can protect the electrical circuit components 91 mounted on the flexible parts from stress due to bending. Also, providing the frames 608 in the mounting areas of the electrical circuit components 91 in the flexible parts 501 to 504 can protects the electrical circuit components 91 from stress due to bending even when the flexible parts bend at any position other than the grooves 85.

The shape of the frames 608 is such that the longitudinal direction of the frames 608 is along the body axis direction, and/or the two or more frames 608 are arranged in the body axis direction. This allows the structure of the flexible part to be such that the flexible part is difficult to bend in the body axis direction and is easy to bend in the body circumference direction. This limitation on the bending direction provides the RF receiving coil that can be easily wound around the body and easily handled.

Also, providing the windows 83 in the air-bubbles-containing resin 602 and mounting the electrical circuit components 91 on the flexible substrate 601 exposed through the windows 83 allow tuning or the like to be performed on the electrical circuit components 91 while the flexible substrate 601 is covered with the air-bubbles-containing resin. Also, in use, the lids 607 are attached to the windows 83, which prevents the test object 103 or the operator from directly touching the flexible substrate 601 or the mounted components.

Further, in the embodiment, as shown in FIGS. 18(*a*) and 18(*b*), in the fitting section of the flexible part and the rigid part, the rubber packings 172 are disposed between the rigid case 604 and the air-bubbles-containing resin 602. This allows the air-bubbles-containing resin 602 to be less likely damaged and more durable when the flexible part bends.

Also, disposing the guide pins 515-1 and 515-2 and the connectors 514-1 to 514-4 in alignment in the connector sections allows the RF receiving coil to be difficult to be disconnected by an external force.

Second Embodiment

Figure 20:
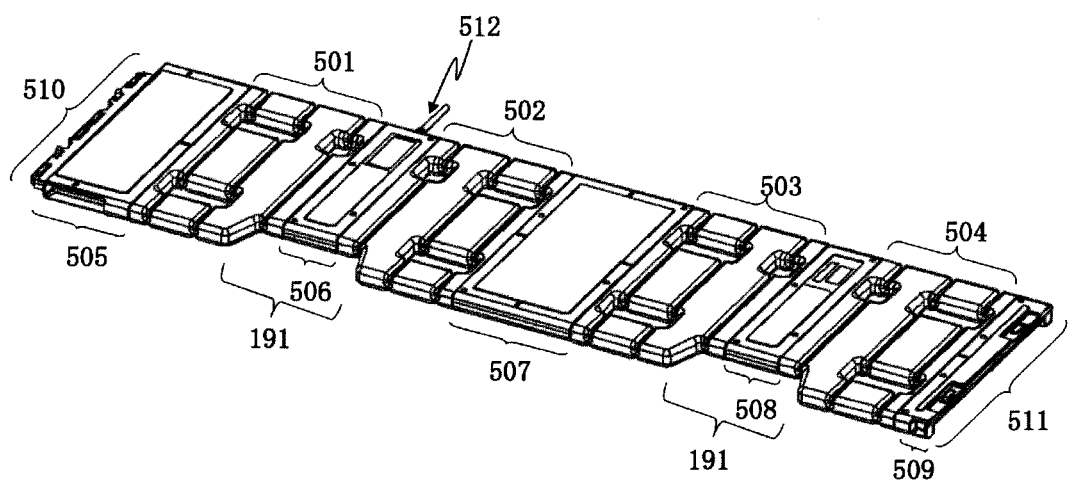
FIG. 20 A perspective view showing the RF receiving coil according to a second embodiment with the connector sections disconnected.
Figure 2:
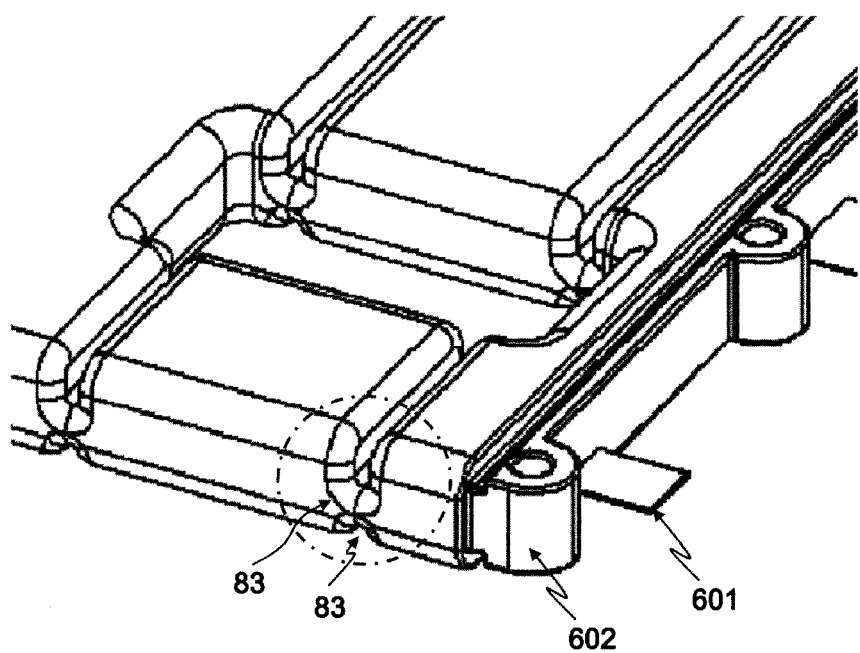

As a second embodiment, an RF receiving coil that can be fitted to the test object 103 when the test object 103 is a smaller body is described. The basic configuration of this RF receiving coil is similar to that of the RF receiving coil of the first embodiment except some differences. One difference is that, as shown in FIGS. 20, 21(a) and 21(b), the width (length in the body axis direction) of the RF receiving coil is decreased to form notches 191 at the positions corresponding to the armpits of the test object 103. Another difference is that, as shown in FIG. 22, the grooves 83 are formed not only in the outer circumference surface side but also in the body surface side of the flexible parts 501 to 504. The positions of the grooves 83 on the body surface side correspond to those on the outer circumference surface side.

Since the notches 191 are provided at the positions corresponding to the armpits of the test object 103, the RF receiving coil, when wound around the test object 103, can cover the test object 103 to near the neck in a portion of the body other than the side portions (that is, the front and back portions of the body), as shown in FIG. 21(b).

Also, providing the grooves 85 on the both sides allows the RF receiving coil to more largely bend and to be shaped into a cylinder having a smaller curvature radius. Accordingly, the RF receiving coil can be closely fitted to the test object 103 having a smaller girth.

The remaining configuration and manufacturing method are the same as those of the first embodiment and will not be further explained.

The invention claimed is:

1. A magnetic resonance imaging apparatus, characterized by comprising:
  one pair of static magnetic field generating means disposed to sandwich a space in which a test object is placed;
  magnetic field generating means configured to apply a high-frequency magnetic field and a gradient magnetic field to the test object placed in the static magnetic field; and
  receiving means configured to receive a nuclear magnetic resonance signal generated from the test object, wherein the receiving means includes a receiving coil having a predetermined coil pattern and can be shaped into a cylinder; wherein
  the receiving coil includes flexible parts and rigid parts alternately disposed along the circumference direction when shaped into the cylinder; and
  the flexible parts include a flexible substrate on which a portion of the predetermined coil pattern is mounted and an air-bubbles-containing resin section for covering both surfaces of the flexible substrate, and wherein
  a thickness of a portion of the air-bubbles-containing resin section positioned on an inner circumference surface side of the flexible parts when shaped into the cylinder is thinner than a portion of the air-bubbles-containing resin section positioned on an outer circumference surface side.

2. The magnetic resonance imaging apparatus according to claim 1, characterized in that:
  the rigid parts include a rigid substrate on which a portion of the predetermined coil pattern is mounted and a case for containing the rigid substrate;
  fitting sections are formed on the edge of the air-bubbles-containing resin section, the fitting sections being shaped to be fit to the edge of the case;
  the fitting sections are fitted to the case to connect the edges of the flexible parts and the rigid parts; and
  the coil patterns of the rigid substrate and the flexible substrate are electrically connected at the edge at which the flexible parts and the rigid parts are connected.

3. The magnetic resonance imaging apparatus according to claim 2, characterized in that elastic members are disposed between the fitting sections of the air-bubbles-containing resin section and the case.

4. The magnetic resonance imaging apparatus according to claim 1, characterized in that grooves in the direction parallel to the body axis of the test object are provided in the portion of the air-bubbles-containing resin section positioned on the outer circumference surface side when shaped into the cylinder.

5. The magnetic resonance imaging apparatus according to claim 4, characterized in that, in the portion of the air-bubbles-containing resin section positioned on the inner circumference surface side when shaped into the cylinder, grooves in the direction parallel to the body axis of the test object are provided at the positions corresponding to the positions of the grooves on the outer circumference surface side.

6. The magnetic resonance imaging apparatus according to claim 5, characterized in that the grooves in the portion of the air-bubbles-containing resin section on the outer circumference surface side is deeper than the grooves in the portion of the air-bubbles-containing resin section on the inner circumference surface side.

7. The magnetic resonance imaging apparatus according to claim 1, characterized in that:
  the flexible parts include a frame embedded in a predetermined area of the portion of the air-bubbles-containing resin section positioned on the outer circumference surface side when shaped into the cylinder; and
  the shape of the frame is such that the longitudinal direction of the frame is along the body axis direction of the test object.

8. The magnetic resonance imaging apparatus according to claim 7, characterized in that the inside of the frame is not covered with the air-bubbles-containing resin section and functions as a window through which the flexible substrate is exposed, and electrical circuit components are mounted on the flexible substrate within the window.

9. The magnetic resonance imaging apparatus according to claim 8, characterized in that a lid for covering the window is secured to the frame.

10. The magnetic resonance imaging apparatus according to claim 9, characterized in that elastic members are disposed between the lid and the air-bubbles-containing resin section at the positions at which the lid is secured.

11. The magnetic resonance imaging apparatus according to claim 1, characterized in that:
  the flexible parts include two or more frames embedded in a predetermined area of the portion of the air-bubbles-containing resin section positioned on the outer circumference surface side when shaped into the cylinder; and
  the two or more frames are arranged and secured along the body axis direction of the test object.

12. The magnetic resonance imaging apparatus according to claim 11, characterized in that the inside of the frame is not covered with the air-bubbles-containing resin section and functions as a window through which the flexible substrate is exposed, and electrical circuit components are mounted on the flexible substrate within the window.

13. The magnetic resonance imaging apparatus according to claim 1, characterized in that the receiving coil is a coil to be wound around the body of the test object and has notches at the positions corresponding to the armpits of the test object when shaped into the cylinder.

14. The magnetic resonance imaging apparatus according to claim 1, characterized in that:
the receiving coil includes a belt-shaped member in which the flexible parts and the rigid parts are alternately disposed and first and second connecting sections disposed to one end and the other end of the belt-shaped member, respectively, to connect the both ends;
as guide members for aligning the first and second connecting sections, one or more guide protrusions are provided to one of the first and second connecting sections, and guide holes to be engaged with the guide protrusions are provided to the other; as fitting members for fitting the first connecting section to the second connecting section, one or more first fitting sections and second fitting sections that fit the first fitting sections are provided; and
the one or more guide members and the one or more fitting members are disposed in alignment.

15. The magnetic resonance imaging apparatus according to claim 1, characterized in that:
the coil pattern of the flexible parts is divided into two or more portions by one or more slits;
the divided coil patterns are electrically connected by capacitors having a predetermined capacitance; and
the capacitance of the capacitors are considered electrically short-circuited at a frequency of nuclear magnetic resonance signal, and considered electrically open at a frequency of eddy current.

16. A receiving coil shapable into a cylinder, for a magnetic resonance imaging apparatus, characterized in that:
the receiving coil includes flexible parts and rigid parts alternately disposed along the circumference direction when shaped into the cylinder; and the flexible parts include a flexible substrate on which a portion of a predetermined coil pattern is mounted and an air-bubbles-containing resin section for covering the both surfaces of the flexible substrate, wherein
a thickness of a portion of the air-bubbles-containing resin section positioned on an inner circumference surface side of the flexible parts when shaped into the cylinder is thinner than a portion of the air-bubbles-containing resin section positioned on an outer circumference surface side.

* * * * *